(12) United States Patent
Ozaki

(10) Patent No.: US 10,043,897 B2
(45) Date of Patent: Aug. 7, 2018

(54) SEMICONDUCTOR DEVICE AND METHOD OF FABRICATING SEMICONDUCTOR DEVICE

(71) Applicant: FUJITSU LIMITED, Kawasaki-shi, Kanagawa (JP)

(72) Inventor: Shirou Ozaki, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 14/742,165

(22) Filed: Jun. 17, 2015

(65) Prior Publication Data

US 2015/0311333 A1    Oct. 29, 2015

Related U.S. Application Data

(62) Division of application No. 13/721,257, filed on Dec. 20, 2012.

(30) Foreign Application Priority Data

Mar. 16, 2012  (JP) ................. 2012-061259

(51) Int. Cl.
*H01L 29/778* (2006.01)
*H01L 29/66* (2006.01)
(Continued)

(52) U.S. Cl.
CPC .... *H01L 29/7787* (2013.01); *H01L 21/28264* (2013.01); *H01L 29/2003* (2013.01);
(Continued)

(58) Field of Classification Search
CPC ............. H01L 29/7787; H01L 29/2003; H01L 29/205; H01L 29/513; H01L 29/517; H01L 29/518
See application file for complete search history.

(56) References Cited

U.S. PATENT DOCUMENTS

2006/0011915 A1*  1/2006  Saito ................. H01L 29/1066
                                                     257/65
2006/0157729 A1   7/2006  Ueno et al.
(Continued)

FOREIGN PATENT DOCUMENTS

CN     102239549     11/2011
JP     2002-359256   12/2002
(Continued)

OTHER PUBLICATIONS

CNOA—Office Action dated Apr. 3, 2015 issued with respect to the corresponding Chinese Patent Application No. 201210576962.2, with English translation.
(Continued)

*Primary Examiner* — Marc Armand
*Assistant Examiner* — Quinton Brasfield
(74) *Attorney, Agent, or Firm* — Fujitsu Patent Center

(57) ABSTRACT

A method of fabricating a semiconductor device may form a nitride semiconductor layer on a substrate, form a first insulator layer on the nitride semiconductor layer by steam oxidation of ALD, form a second insulator layer on the first insulator layer by oxygen plasma oxidation of ALD, form a gate electrode on the second insulator layer, and form a source and drain electrodes on the nitride semiconductor layer. The nitride semiconductor layer may include a first semiconductor layer on the substrate, and a second semiconductor layer on the first semiconductor layer.

9 Claims, 33 Drawing Sheets

(51) Int. Cl.
- *H01L 21/28* (2006.01)
- *H01L 29/40* (2006.01)
- *H01L 29/51* (2006.01)
- *H01L 29/20* (2006.01)
- *H01L 29/205* (2006.01)
- *H01L 29/423* (2006.01)
- *H01L 23/00* (2006.01)

(52) U.S. Cl.
CPC .......... *H01L 29/205* (2013.01); *H01L 29/401* (2013.01); *H01L 29/513* (2013.01); *H01L 29/517* (2013.01); *H01L 29/518* (2013.01); *H01L 29/66431* (2013.01); *H01L 29/66462* (2013.01); *H01L 29/7786* (2013.01); *H01L 24/29* (2013.01); *H01L 24/32* (2013.01); *H01L 24/45* (2013.01); *H01L 24/48* (2013.01); *H01L 24/49* (2013.01); *H01L 24/73* (2013.01); *H01L 29/4236* (2013.01); *H01L 2224/0603* (2013.01); *H01L 2224/29101* (2013.01); *H01L 2224/32245* (2013.01); *H01L 2224/45124* (2013.01); *H01L 2224/48247* (2013.01); *H01L 2224/48257* (2013.01); *H01L 2224/4903* (2013.01); *H01L 2224/73265* (2013.01); *H01L 2924/1033* (2013.01); *H01L 2924/13064* (2013.01); *H01L 2924/181* (2013.01)

(56) References Cited

U.S. PATENT DOCUMENTS

| | | | |
|---|---|---|---|
| 2006/0157733 A1* | 7/2006 | Lucovsky | H01L 21/28194 257/192 |
| 2006/0220063 A1* | 10/2006 | Kurachi | H01L 29/7787 257/194 |
| 2007/0026688 A1 | 2/2007 | Song et al. | |
| 2007/0051998 A1 | 3/2007 | Kil et al. | |
| 2007/0210332 A1 | 9/2007 | Ueno et al. | |
| 2007/0241390 A1 | 10/2007 | Tanaka et al. | |
| 2009/0194791 A1* | 8/2009 | Kanamura | H01L 29/42368 257/192 |
| 2010/0117118 A1 | 5/2010 | Dabiran et al. | |
| 2010/0184262 A1* | 7/2010 | Smorchkova | H01L 29/42316 257/E21.403 |
| 2010/0243989 A1 | 9/2010 | Makabe et al. | |
| 2011/0140121 A1* | 6/2011 | Lee | H01L 29/1033 257/76 |
| 2011/0147710 A1 | 6/2011 | Dewey et al. | |
| 2011/0233689 A1 | 9/2011 | Hata et al. | |
| 2011/0233699 A1 | 9/2011 | Takenaga et al. | |
| 2012/0112263 A1 | 5/2012 | Tanaka et al. | |
| 2013/0146943 A1* | 6/2013 | Edwards | H01L 29/66462 257/192 |

FOREIGN PATENT DOCUMENTS

| | | |
|---|---|---|
| JP | 2006-222414 | 8/2006 |
| JP | 2010-232377 | 10/2010 |
| JP | 2011-198837 | 10/2011 |
| JP | 2012-4513 | 1/2012 |
| WO | 2010/044431 A1 | 4/2010 |

OTHER PUBLICATIONS

USPTO, (Brasfield) Final Rejection, dated Mar. 20, 2015, in parent U.S. Appl. No. 13/721,257 [pending].
USPTO, (Brasfield) Non-Final Rejection, dated Nov. 7, 2014, in parent U.S. Appl. No. 13/721,257 [pending].
USPTO, (Brasfield) Final Rejection, dated May 6, 2014, in parent U.S. Appl. No. 13/721,257 [pending].
USPTO, (Brasfield) Final Rejection, dated Jan. 30, 2014, in parent U.S. Appl. No. 13/721,257 [pending].
USPTO, (Brasfield) Non-Final Rejection, dated Jun. 28, 2013, in parent U.S. Appl. No. 13/721,257 [pending].
USPTO, (Brasfield) Restriction Requirement, dated May 1, 2013, in parent U.S. Appl. No. 13/721,257 [pending].
JPOA—Office Action dated Sep. 29, 2015 issued with respect to the basic Japanese Patent Application No. 2012-061259, with partial English translation.
CNOA—Office Action dated Dec. 16, 2015 issued with respect to the corresponding Chinese Patent Application No. 201210576962.2, with English translation.
TWOA—Office Action dated Aug. 3, 2015 issued with respect to the corresponding R.O.C. / Taiwan Patent Application No. 101149489, with full English translation.
JPOA—Office Action dated Sep. 13, 2016 issued with respect to the basic Japanese Patent Application No. 2015-233716, with partial English translation.

* cited by examiner

SEMICONDUCTOR DEVICE AND METHOD OF FABRICATING SEMICONDUCTOR DEVICE

CROSS-REFERENCE TO RELATED APPLICATIONS

This application is a divisional of application Ser. No. 13/721,257, filed Dec. 20, 2012, which is based upon and claims the benefit of priority of the prior Japanese Patent Application No. 2012-061259, filed on Mar. 16, 2012, the entire contents of which are incorporated herein by reference.

FIELD

The embodiments discussed herein are related to a semiconductor device and a method of fabricating the semiconductor device.

BACKGROUND

Materials such as GaN, AlN, and InN that are nitride semiconductors, and mixed crystals of such nitride semiconductors, have a relatively wide band gap and may thus be used for high-output electronic devices, short-wavelength light emitting devices, or the like. For example, the nitride semiconductor GaN has a band gap of 3.4 eV, which is wider than the band gap of 1.1 eV for Si, and the band gap of 1.4 eV for GaAs.

The high-output electronic devices may include a FET (Field Effect Transistor), particularly a HEMT (High Electron Mobility Transistor). The HEMT that uses the nitride semiconductor may be used for a high-output, high-efficient amplifier, a high-power switching device, and the like. Particularly, in the HEMT using a AlGaN electron supply layer and a GaN channel layer, a piezo polarization occurs in AlGaN due to a distortion caused by the difference in lattice constants of AlGaN and GaN, and a high-density 2DEG (Two-Dimensional Electron Gas) is generated. For this reason, this HEMI may operate at a high voltage, and may be used for a high-efficient switching device, and a high-voltage power device employed in electric cars and the like.

Usually, the 2DEG exists in a region immediately under a gate, even in a state in which no voltage is applied to a gate electrode or the like, and the device that is fabricated becomes a normally-on device. Hence, in general, in order to fabricate a normally-off device, a part of a nitride semiconductor layer in the region where the gate electrode is formed is removed by etching, in order to reduce the distance between a channel and the gate electrode and form a gate recess structure.

From the point of view of improving characteristics of the device or the like, a gate insulator layer may be formed between the gate electrode and the nitride semiconductor layer. Aluminum oxide ($Al_2O_3$) formed by ALD (Atomic Layer Deposition) is suited for such a gate insulator layer, and may be regarded as a promising material for use as the gate insulator layer, because the withstand voltage may be 10 MV/cm t0 30 MV/cm and high.

A field effect compound semiconductor device is proposed in a Japanese Laid-Open Patent Publication No. 2002-359256, for example.

Residue of impurities originating from a source gas may exist in an aluminum oxide layer that is formed by the ALD. More particularly, in the aluminum oxide layer formed by the ALD, hydroxyl group (OH group) may remain in an aluminum hydroxide (Al(OH)x) state, and the OH group may act as an electron trap. Hence, this electron trap may cause a threshold variation of the gate voltage and prevent the fabrication of the normally-off device.

On the other hand, the aluminum oxide layer may be formed on the nitride semiconductor layer, such as GaN. However, GaOx may be formed at an interface between the GaN and the aluminum oxide layer, and the GaOx may also act as an electron trap. Accordingly, this electron trap may cause the threshold variation of the gate voltage and similarly prevent the fabrication of the normally-off device.

When the gate insulator layer is formed on the gate recess structure, the step coverage may become relatively poor. However, in the case of the aluminum oxide layer formed by the ALD, a satisfactory step coverage may be obtained.

SUMMARY

Accordingly, it is an object in one aspect of the embodiment to provide a semiconductor device that uses a nitride semiconductor and may reduce the threshold variation of the gate voltage, and a method of fabricating such semiconductor devices with high uniformity and yield.

According to one aspect of the present invention, a method of fabricating a semiconductor device may include forming a nitride semiconductor layer on a substrate; forming a first insulator layer on the nitride semiconductor layer by steam oxidation of ALD (Atomic Layer Deposition) using $H_2O$ source gas, or by oxidation of ALD using $O_3$ source gas; forming a second insulator layer on the first insulator layer by oxygen plasma oxidation of ALD using $O_2$ source gas; forming a gate electrode on the second insulator layer; and forming a source electrode and a drain electrode on the nitride semiconductor layer, wherein the forming the nitride semiconductor layer includes forming a first semiconductor layer on the substrate, and forming a second semiconductor layer on the first semiconductor layer.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Figure 1A:
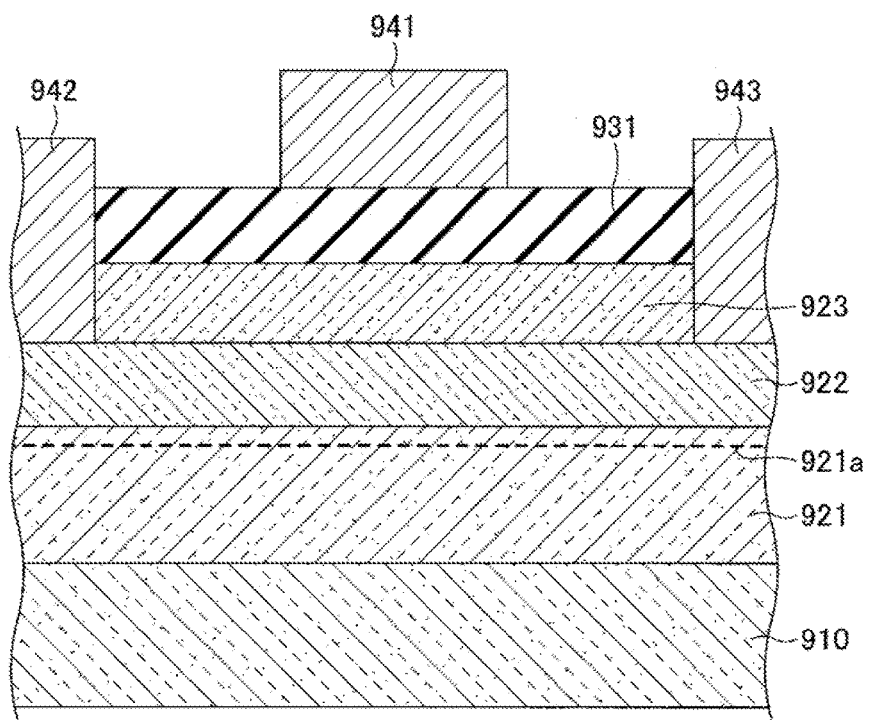
FIGS. 1A and 1B are cross sectional views for explaining a semiconductor device having a structure not formed with a recess.

Preferred embodiments of the present invention will be described with reference to the accompanying drawings.

A description will now be given of the semiconductor device and the method of fabricating the semiconductor device in each embodiment according to the present invention. In the following description, those parts that are the same are designated by the same reference numerals, and a description thereof will be omitted.

First Embodiment

Characteristics of Aluminum Oxide Layer Formed by ALD

An aluminum oxide ($Al_2O_3$) layer may be formed by the ALD according to a first method or a second method. The first method employs steam oxidation to form the aluminum oxide layer using trimethylaluminum ($Al(CH_3)_3$) and $H_2O$ as source gases. The second method employs oxygen plasma oxidation to form the aluminum oxide layer using $Al(CH_3)_3$ and $O_2$ as source gases. In the ALD, the steam oxidation forms the layer without generating plasma, while the oxygen plasma oxidation forms the layer by generating plasma by oxygen ($O_2$) or ozone ($O_3$).

Figure 1B:
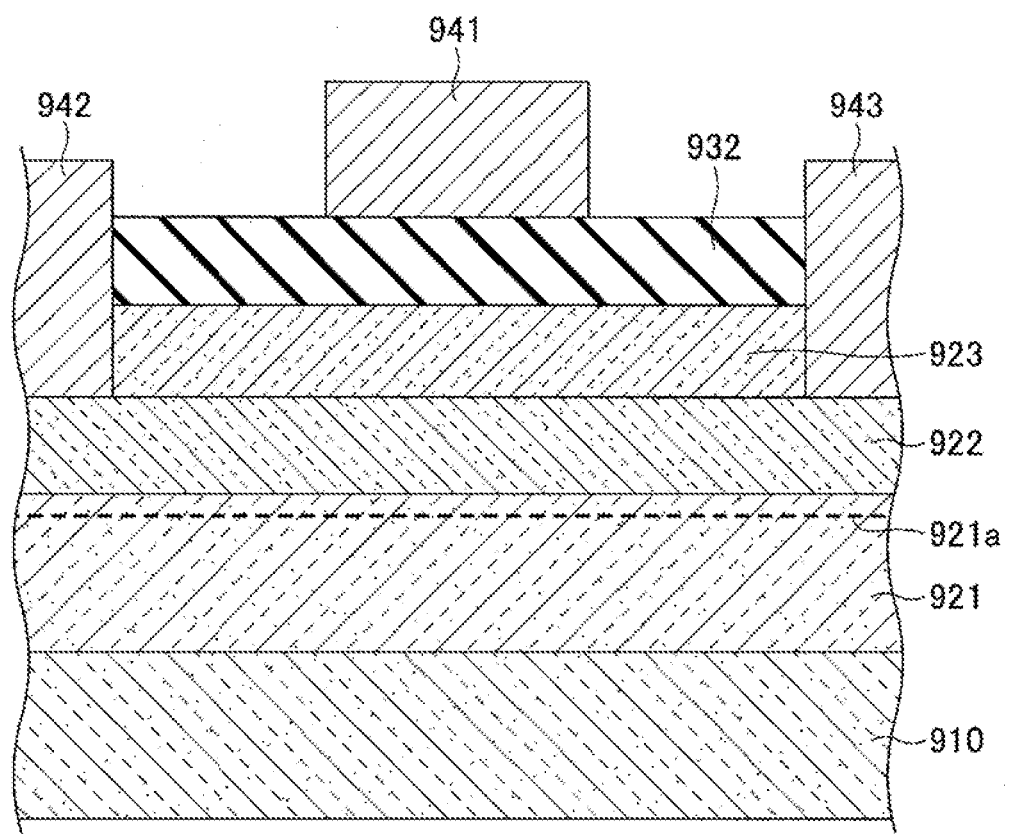

As illustrated in FIGS. 1A and 1B, a semiconductor device using an aluminum oxide layer formed by the oxygen plasma oxidation, as the gate insulator layer, and a semiconductor device using an aluminum oxide layer formed by the steam oxidation, as the gate insulator layer, may be fabricated.

The semiconductor device illustrated in FIG. 1A may be a HEMT using an aluminum oxide layer 931 formed by the oxygen plasma oxidation, as the gate insulator layer. More particularly, a GaN channel layer 921, a AlGaN electron supply layer 922, and a GaN cap layer 923 may be successively stacked, as nitride semiconductor layers, on a substrate 910. Hence, a 2DEG 921a may be formed in the channel layer 921 in a vicinity of an interface between the channel layer 921 and the electron supply layer 922. In addition, an aluminum oxide layer 931 may be formed on the cap layer 923 by the oxygen plasma oxidation, as the gate insulator layer. A gate electrode 941 may be formed on the aluminum oxide layer 931. A source electrode 942 and a drain electrode 943 may be formed on the electron supply layer 922.

On the other hand, the semiconductor device illustrated in FIG. 1B may be a HEMT using an aluminum oxide layer 932 formed by the steam oxidation, as the gate insulator layer. More particularly, a GaN channel layer 921, a AlGaN electron supply layer 922, and a GaN cap layer 923 may be successively stacked, as nitride semiconductor layers, on a substrate 910. Hence, a 2DEG 921a may be formed in the channel layer 921 in a vicinity of an interface between the channel layer 921 and the electron supply layer 922. In addition, an aluminum oxide layer 932 may be formed on the cap layer 923 by the steam oxidation, as the gate insulator layer. A gate electrode 941 may be formed on the aluminum oxide layer 932. A source electrode 942 and a drain electrode 943 may be formed on the electron supply layer 922.

Next, a description will be given of the characteristics of the HEMT having the structure illustrated in FIG. 1A and the HEMT having the structure illustrated in FIG. 1B, by referring to FIGS. 2 through 5. In FIGS. 2 through 5, the HEMT illustrated in FIG. 1A using the aluminum oxide layer 931 formed by the oxygen plasma oxidation will be referred to as a HEMT 1A, and the HEMT illustrated in FIG. 1B using the aluminum oxide layer 932 formed by the steam oxidation will be referred to as a HEMT 1B.

Figure 2:
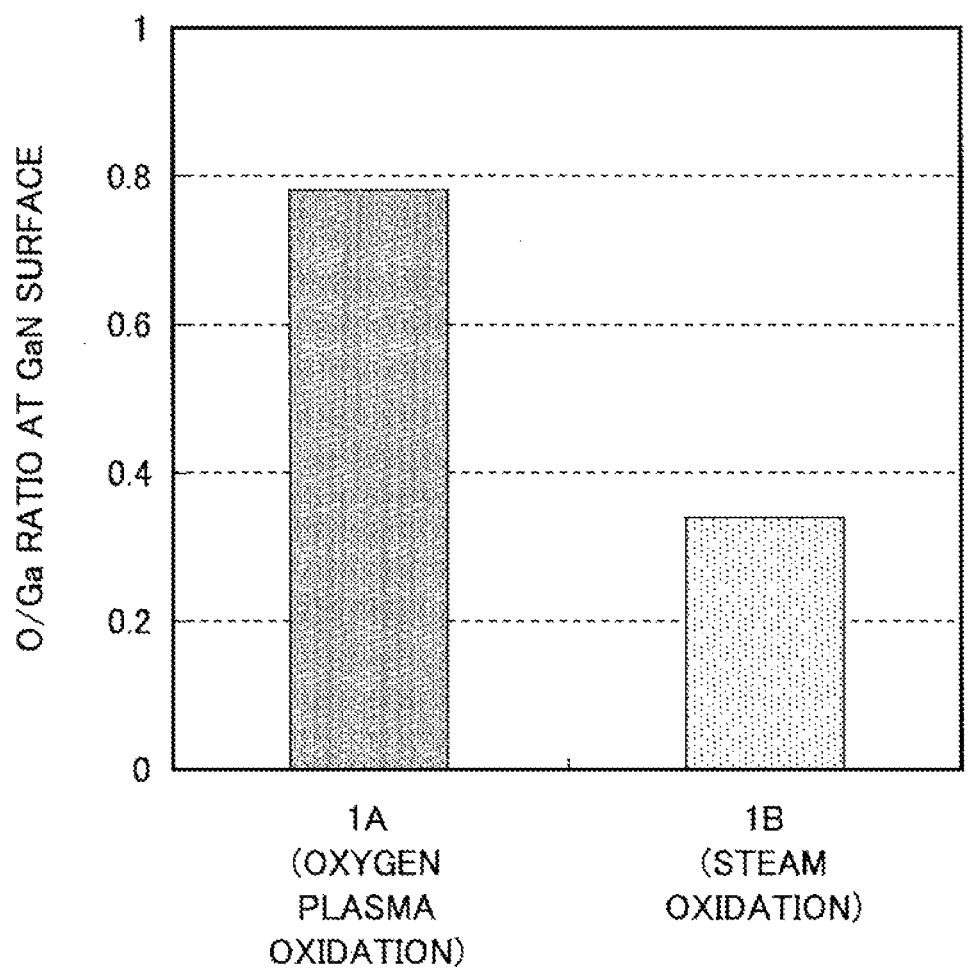
FIG. 2 is a diagram for explaining a O/Ga ratio on a GaN surface of the semiconductor device having the structure not formed with the recess.

FIG. 2 is a diagram for explaining a O/Ga ratio (ratio of oxygen atoms with respect to gallium atoms) on a GaN surface of the cap layer 923 in the semiconductor device having the structure not formed with the recess. The O/Ga ratio is approximately 0.78 for the HEMT 1A using the aluminum oxide layer 931 formed by the oxygen plasma oxidation. On the other hand, the O/Ga ratio is approximately 0.34 for the HEMT 1B using the aluminum oxide layer 932 formed by the steam oxidation. Hence, the O/Ga ratio of the HEMT 1B using the aluminum oxide layer 932 formed by the steam oxidation is lower than the O/Ga ratio of the HEMT 1A using the aluminum oxide layer 931 formed by the oxygen plasma oxidation. In other words, a ratio of oxygen atoms with respect to metal atoms included in the nitride semiconductor layer, in a vicinity of an interface between the nitride semiconductor layer and the insulator layer, may be 0.4 or lower for the HEMT 1B.

Figure 3:
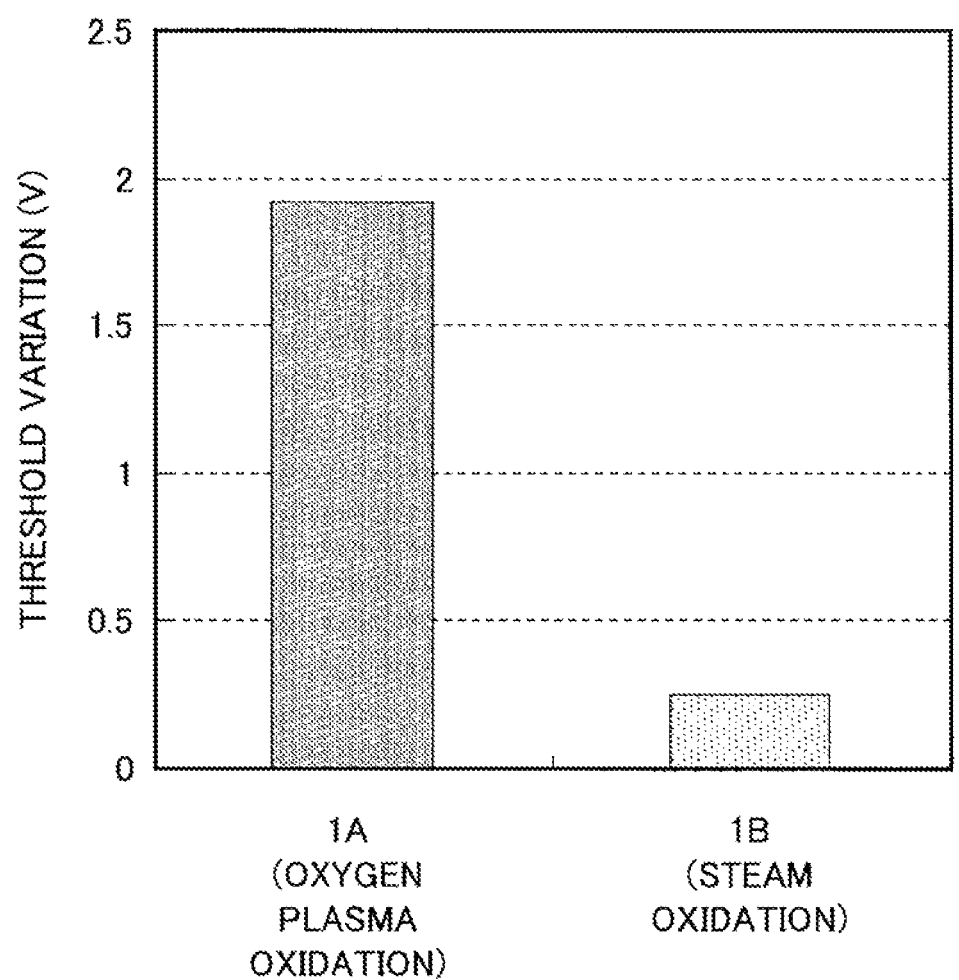
FIG. 3 is a diagram for explaining a threshold variation of the semiconductor device having the structure not formed with the recess.

FIG. 3 is a diagram for explaining a threshold variation of the gate electrode 941 of the semiconductor device having the structure not formed with the recess. The threshold variation is approximately 1.9 V for the HEMT 1A using the aluminum oxide layer 931 formed by the oxygen plasma oxidation. On the other hand, the threshold variation is approximately 0.25 V for the HEMT 1B using the aluminum oxide layer 932 formed by the steam oxidation. Hence, the threshold variation of the HEMT 1B using the aluminum oxide layer 932 formed by the steam oxidation is lower than the threshold variation of the HEMT 1A using the aluminum oxide layer 931 formed by the oxygen plasma oxidation.

Figure 4:
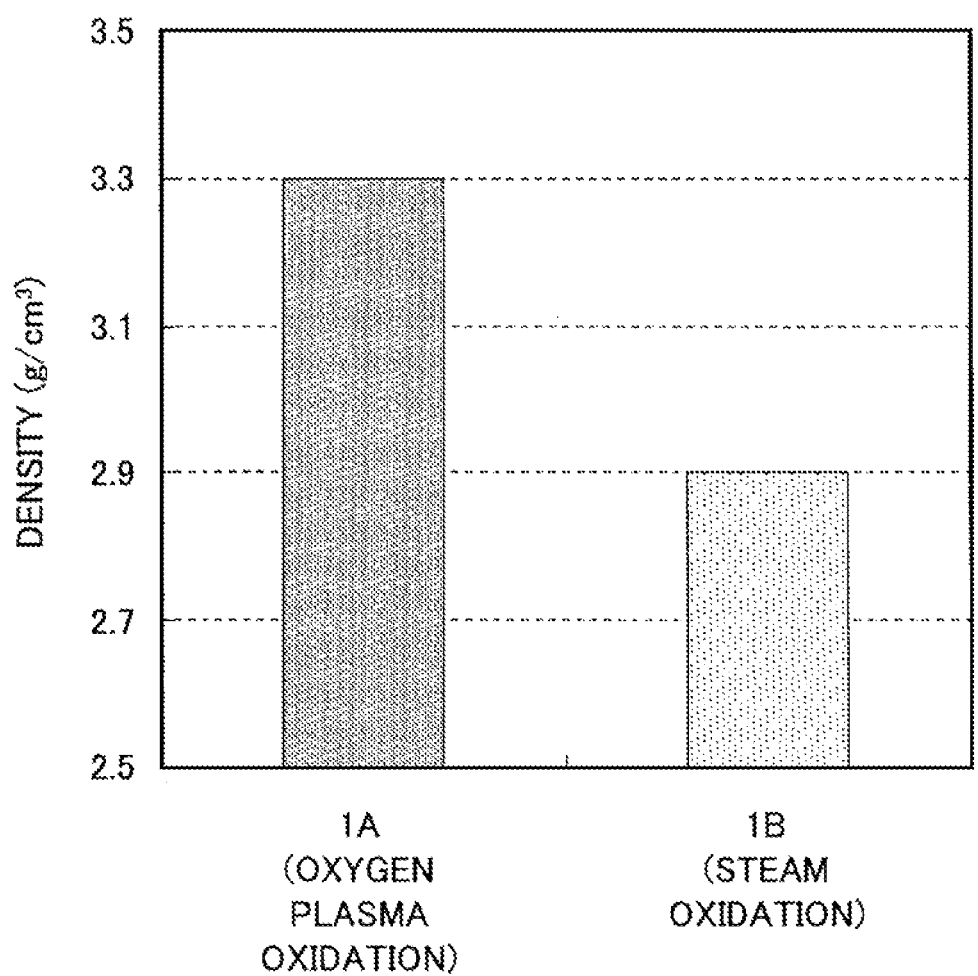
FIG. 4 is a diagram for explaining a density of an insulator layer in the semiconductor device having the structure not formed with the recess.

FIG. 4 is a diagram for explaining a density of an insulator layer in the semiconductor device having the structure not formed with the recess. The density is approximately 3.3 g/cm$^3$ for the HEMT 1A using the aluminum oxide layer 931 formed by the oxygen plasma oxidation. On the other hand, the density is approximately 2.9 g/cm$^3$ for the HEMT 1B using the aluminum oxide layer 932 formed by the steam oxidation. Hence, the density of the HEMT 1B using the aluminum oxide layer 932 formed by the steam oxidation is lower than the density of the HEMT 1A using the aluminum oxide layer 931 formed by the oxygen plasma oxidation.

Figure 5:
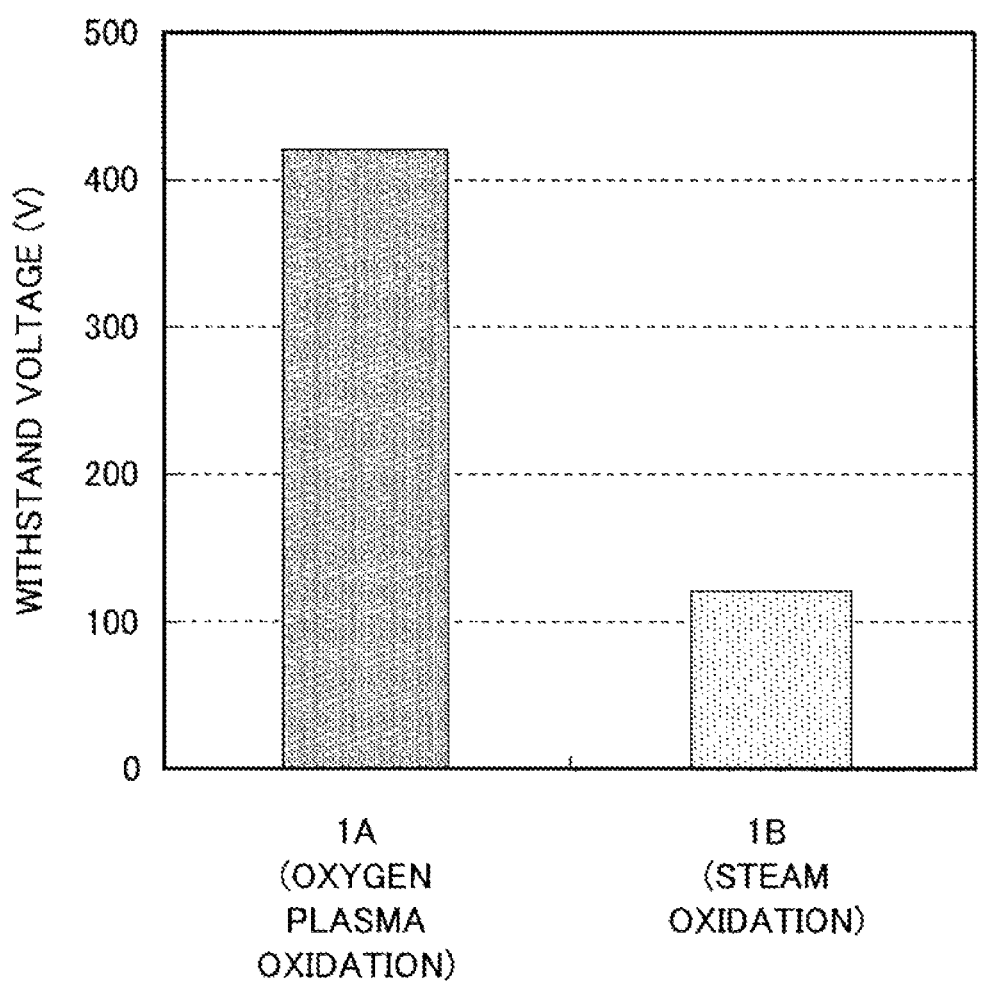
FIG. 5 is a diagram for explaining a withstand voltage of the semiconductor device having the structure not formed with the recess.

FIG. 5 is a diagram for explaining a drain-source withstand voltage of the semiconductor device having the structure not formed with the recess. The withstand voltage is approximately 420 V for the HEMT 1A using the aluminum oxide layer 931 formed by the oxygen plasma oxidation. On the other hand, the withstand voltage is approximately 120 V for the HEMI 1B using the aluminum oxide layer 932 formed by the steam oxidation. Hence, the withstand voltage of the HEMI 1B using the aluminum oxide layer 932 formed by the steam oxidation is lower than the withstand voltage of the HEMI 1A using the aluminum oxide layer 931 formed by the oxygen plasma oxidation.

Accordingly, from the point of view of the O/Ga ratio at the GaN surface of the cap layer 923 and the threshold variation of the gate electrode 941, the HEMT 1B using the aluminum oxide layer 932 formed by the steam oxidation may be more preferable than the HEMI 1A using the aluminum oxide layer 931 formed by the oxygen plasma oxidation. On the other hand, from the point of view of the density of the gate insulator layer and the drain-source withstand voltage, the HEMT 1A using the aluminum oxide layer 931 formed by the oxygen plasma oxidation may be more preferable than the HEMI 1B using the aluminum oxide layer 932 formed by the steam oxidation.

In other words, from the point of view of the O/Ga ratio at the GaN surface and the threshold variation, the gate insulator layer may preferably be the aluminum oxide layer 932 formed by the steam oxidation. On the other hand, from the point of view of the density and the withstand voltage, the gate insulator layer may preferably be the aluminum oxide layer 931 formed by the oxygen plasma oxidation. The layer formed by the oxidation using Al(CH$_3$)$_3$ and ozone (O$_3$) as the source gases may be equivalent to the layer formed by the oxidation using Al(CH$_3$)$_3$ and O$_2$ as the source gases. Hence, the layer may be formed by the ALD that carries out the oxidation using Al(CH$_3$)$_3$ and ozone (O$_3$) as the source gases, in place of the ALD that carries out the oxidation using Al(CH$_3$)$_3$ and O$_2$ as the source gases.

(Aluminum Hydroxide Density in Aluminum Oxide)

Next, a description will be given of the aluminum hydroxide density in the aluminum oxide formed by the ALD. Immediately after the aluminum oxide layer is formed by the steam oxidation or the oxygen plasma oxidation, residual aluminum hydroxide (Al(OH)x) may exist in the aluminum oxide layer. However, the density of the residual aluminum hydroxide may be reduced by a PDA (Post Deposition Anneal) that is carried out after forming the aluminum oxide layer. More particularly, it is known that the density of the residual aluminum hydroxide may be reduced to 2% or less by the PDA.

Figure 6:
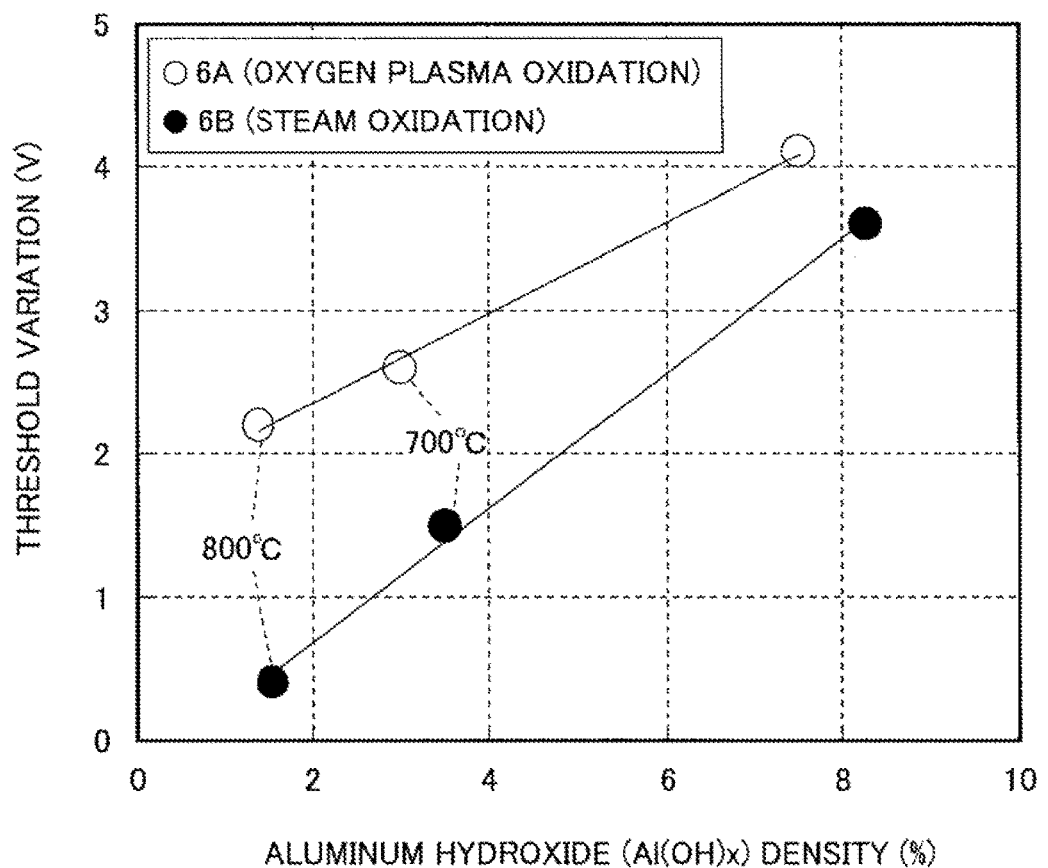
FIG. 6 is a diagram for explaining an aluminum hydroxide density and a threshold variation for a case in which a heat treatment is carried out.

FIG. 6 is a diagram for explaining the aluminum hydroxide density and the threshold variation for a case in which a heat treatment is carried out. More particularly, FIG. 6 illustrates a relationship of the aluminum hydroxide density in the aluminum oxide and the threshold variation when an annealing is carried out after forming the aluminum oxide by the ALD. In FIG. 6, the aluminum oxide layer formed by the oxygen plasma oxidation is denoted by a reference numeral 6A, and the aluminum oxide layer formed by the steam oxidation is denoted by a reference numeral 6B.

Immediately after the aluminum oxide layer is formed, the density of the residual aluminum hydroxide in the aluminum oxide layer 6A formed by the oxygen plasma oxidation is slightly lower than that of the aluminum oxide layer 6B formed by the steam oxidation. On the other hand, the threshold variation of the residual aluminum hydroxide in the aluminum oxide layer 6A formed by the oxygen plasma oxidation is slightly higher than that of the aluminum oxide layer 6B formed by the steam oxidation.

By carrying out the annealing immediately after the aluminum oxide layer is formed, the density of the residual aluminum hydroxide and the threshold variation may become small for the aluminum oxide layer 6A formed by the oxygen plasma oxidation. More particularly, when the annealing temperature is 700° C., the density of the residual aluminum hydroxide may be approximately 3.0%, and the threshold variation may be approximately 2.6 V. Further, when the annealing temperature is 800° C., the density of the residual aluminum hydroxide may be approximately 1.3%, and the threshold variation may be approximately 2.2 V.

Similarly, by carrying out the annealing immediately after the aluminum oxide layer is formed, the density of the residual aluminum hydroxide and the threshold variation may become small for the aluminum oxide layer 6B formed by the steam oxidation. More particularly, when the annealing temperature is 700° C., the density of the residual aluminum hydroxide may be approximately 3.5%, and the threshold variation may be approximately 1.5 V. Further, when the annealing temperature is 800° C., the density of the residual aluminum hydroxide may be approximately 1.5%, and the threshold variation may be approximately 0.4 V.

Accordingly, by carrying out the annealing, the threshold variation for the aluminum oxide layer 6B formed by the steam oxidation may be made even lower than that for the aluminum oxide layer 6A formed by the oxygen plasma oxidation. Based on FIG. 6, the annealing temperature may preferably be in a range of 700° C. or higher and 800° C. or lower, in which range the threshold variation may be 2 V or lower for the aluminum oxide layer 6B formed by the steam oxidation. In this case, the density of the residual aluminum hydroxide may be 4% or lower. In addition, at this annealing temperature range, the threshold variation may be 3 V or lower and the density of the residual aluminum hydroxide may be 4% or lower for the aluminum oxide layer 6A formed by the oxygen plasma oxidation. The annealing temperature exceeding 800° C. may be unpreferable in that the nitride semiconductor layer and the like may be affected by the high annealing temperature.

(Semiconductor Device)

Figure 7:
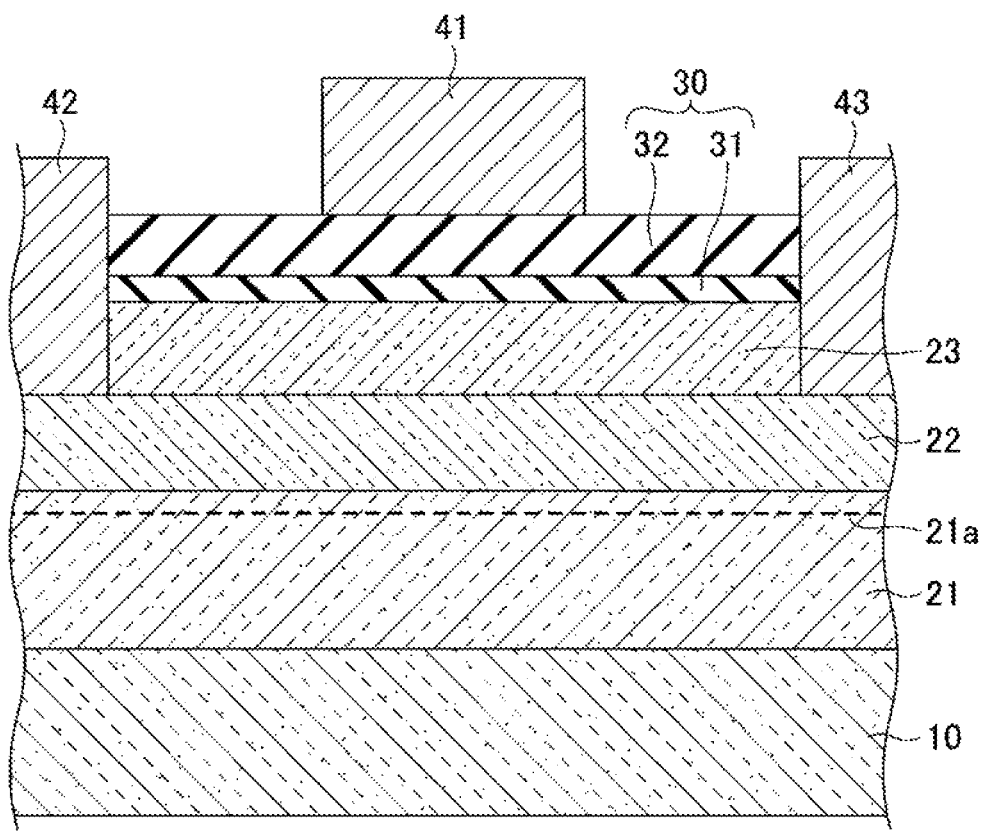
FIG. 7 is a cross sectional view illustrating a structure of the semiconductor device in a first embodiment.

Next, a description will be given of the semiconductor device in a first embodiment, by referring to FIG. 7. FIG. 7 is a cross sectional view illustrating a structure of the semiconductor device in the first embodiment. A HEMT illustrated in FIG. 7 is an example of the semiconductor device in the first embodiment. The HEMT illustrated in FIG. 7 may include nitride semiconductor layers formed on a substrate 10. The nitride semiconductor layers may include a GaN channel layer 21, a AlGaN electron supply layer 22, and a GaN cap layer 23 that are successively stacked on the substrate 10. A 2DEG 21a may be formed in the channel layer 21 in a vicinity of an interface between the channel layer 21 and the electron supply layer 22. In this embodiment, the channel layer 21 may also be referred to as a first semiconductor layer, the electron supply layer 22 may also be referred to as a second semiconductor layer, and the cap layer 23 may also be referred to as a third semiconductor layer.

In this embodiment, an insulator layer 30, that is an example of the gate insulator layer, may be formed on the cap layer 23. The insulator layer 30 may be formed by aluminum oxide layers including a first insulator layer 31 formed on the cap layer 23, and a second insulator layer 32 formed on the first insulator layer 31. The first insulator layer 31 may be formed by an aluminum oxide layer that is formed by the steam oxidation. The second insulator layer 32 may be formed by an aluminum oxide layer that is formed by the oxygen plasma oxidation. A gate electrode 41 may be formed on the insulator layer 30, and a source electrode 42 and a drain electrode 43 may be formed on the electron supply layer 22. FIG. 7 illustrates a structure in which the insulator layer 30 is formed on the cap layer 23, however, the insulator layer 30 may be formed on the electron supply layer 22 when no cap layer 23 is formed.

The semiconductor device in this embodiment is not limited to the HEMT using AlGaN and GaN, and may also be applied to semiconductor devices using other nitride semiconductor materials such as InAlN, InGaAlN, and the like.

(Method of Fabricating Semiconductor Device)

Next, a description will be given of a method of fabricating the semiconductor device in this embodiment, by referring to FIGS. 8A through 9B. FIGS. 8A, 8B, 9A, and 9B are cross sectional views for explaining the method of fabricating the semiconductor device of the first embodiment.

Figure 8A:
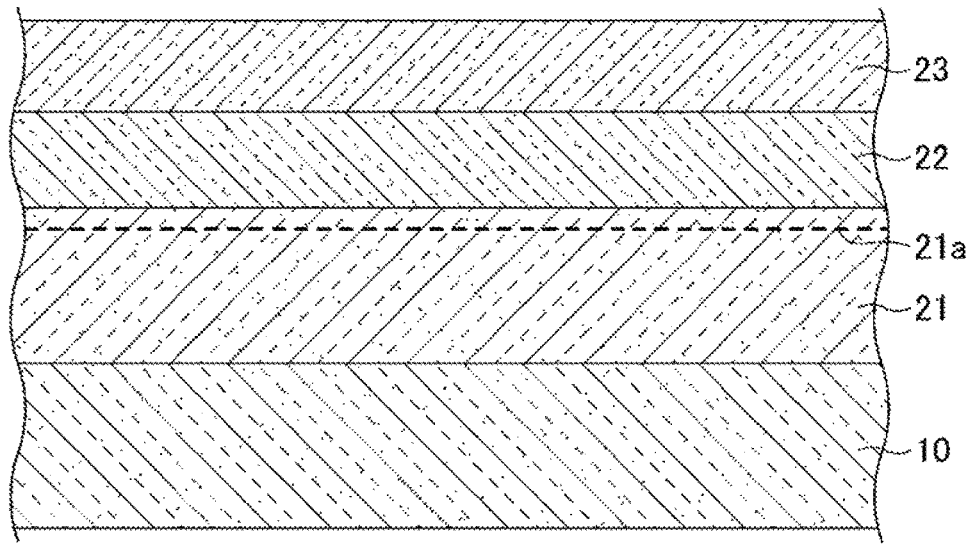
FIGS. 8A and 8B are cross sectional views for explaining a method of fabricating the semiconductor device of the first embodiment.

First, as illustrated in FIG. 8A, nitride semiconductor layers including a buffer layer (not illustrated), the channel layer 21, the electron supply layer 22, and the cap layer 23 are successively formed on the substrate 10 by MOVPE (Metal Organic Vapor Phase Epitaxy). Although the nitride semiconductor layers are epitaxially grown by the MOVPE in this example, the nitride semiconductor layers may be formed by methods other than the MOVPE, such as MBE (Molecular Beam Epitaxy). The substrate 10 may be formed by a silicon substrate, and the buffer layer may be formed by AlN to a thickness of 0.1 μm. The channel layer 21 may be formed by i-GaN to a thickness of 3 μm, the electron supply layer 22 may be formed by n-AlGaN to a thickness of 30 nm, and the cap layer 23 may be formed by n-GaN to a thickness of 5 nm. Hence, the 2DEG 21a is formed in the channel layer 21, in a vicinity of the interface between the channel layer 21 and the electron supply layer 22.

In this embodiment, when forming the AlN, GaN, and AlGaN by the MOVPE, gases such as trimethylaluminum (TMA) that becomes the Al source, trimethylgallium (TMG) that becomes the Ga source, and ammonia ($NH_3$) that becomes the N source, may be used as the source gases. The AlN layer, the GaN layer, and the AlGaN layer, that form the nitride semiconductor layers, may be formed by mixing the source gases described above at predetermined ratios depending on the composition of each nitride semiconductor layer. When forming the nitride semiconductor layer of the semiconductor device in this embodiment by the MOVPE, a flow rate of the ammonia gas may be 100 ccm to 10 LM, the pressure within a deposition chamber when forming the nitride semiconductor layer may be 50 Torr to 300 Torr, and the deposition temperature may be 1000° C. to 1200° C.

The electron supply layer 22 may be formed by n-AlGaN that is doped with Si as the n-type impurity element. More particularly, when forming the electron supply layer 22, $SiH_4$ gas may be added to the source gas at a predetermined flow rate, in order to dope the electron supply layer 22 with Si. The density of Si doped into the n-AlGaN may be $1\times10^{18}$ $cm^{-3}$ to $1\times10^{20}$ $cm^{-3}$, and approximately $5\times10^{18}$ $cm^{-3}$, for example.

In addition, the cap layer 23 may be formed by n-GaN that is doped with Si as the n-type impurity element. More particularly, when forming the cap layer 23, $SiH_4$ gas may be added to the source gas at a predetermined flow rate, in order to dope the cap layer 23 with Si. The density of Si doped into the n-GaN may be $1\times10^{18}$ $cm^{-3}$ to $1\times10^{20}$ $cm^{-3}$, and approximately $5\times10^{18}$ $cm^{-3}$, for example.

Figure 8B:
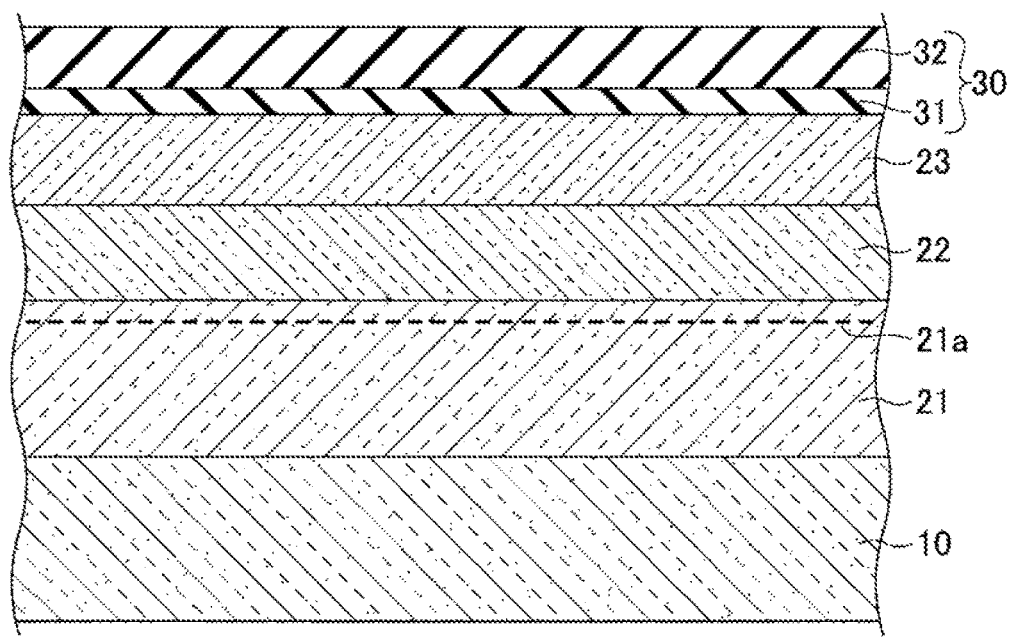

Next, as illustrated in FIG. 8B, the insulator layer 30 may be formed as the gate insulator layer. More particularly, a transformed or altered layer on the surface of the cap layer 23 may be cleaned by hydrogen peroxide sulfate and hydrofluoric acid, and thereafter cleaned by water. Thereafter, the first insulator layer 31 may be formed on the cap layer 23 by forming the aluminum oxide layer by the steam oxidation using $Al(CH_3)_3$ and $H_2O$ as the source gases. The thickness of the first insulator layer 31 that is formed may be 5 nm to 10 nm, and in this embodiment, the thickness of the first insulator layer 31 may be 5 nm. Next, the second insulator layer 32 may be formed on the first insulator layer 31 by forming the aluminum oxide layer by the oxygen plasma oxidation using $Al(CH_3)_3$ and $O_2$ as the source gases. The thickness of the second insulator layer 32 that is formed may be 10 nm to 100 nm, and in this embodiment, the thickness of the second insulator layer 32 may be 35 nm. Hence, the insulator layer 30 may be formed by the first insulator layer 31 and the second insulator layer 32. Thereafter, an annealing may be carried out at a temperature of 700° C. to 800° C.

Figure 9A:
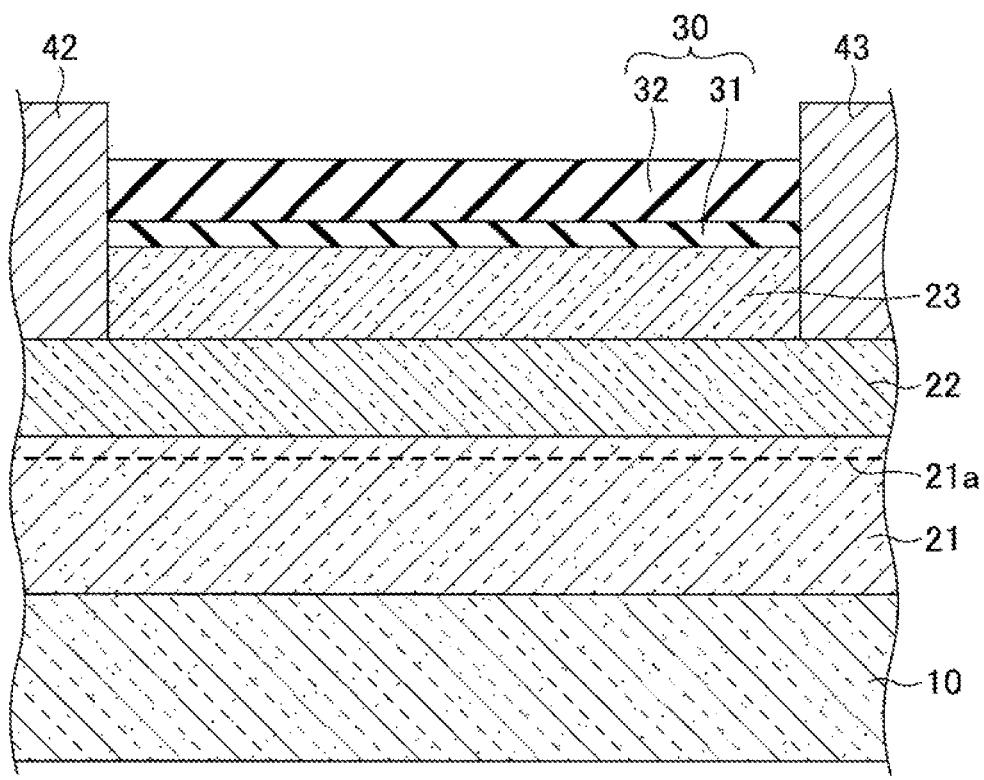
FIGS. 9A and 9B are cross sectional views for explaining the method of fabricating the semiconductor device of the first embodiment.

Next, the source electrode 42 and the drain electrode 43 may be formed as illustrated in FIG. 9A. More particularly, a resist pattern (not illustrated) having openings in regions where the source electrode 42 and the drain electrode 43 are to be formed may be formed on the insulator layer 30, by coating a photoresist on the insulator layer 30, exposing the pattern on the photoresist in an exposure apparatus (not illustrated), and developing the exposed pattern. Thereafter, a dry etching, such as a RIE (Reactive Ion Etching) using fluorine gas, chlorine gas, or the like, may be carried out to remove the insulator 30, the cap layer 23, and all of or a part of the electron supply layer 22 in regions where no resist pattern is formed. The dry etching conditions for the nitride semiconductor may include a chlorine ($Cl_2$) gas flow rate of approximately 30 sccm, a chamber pressure of approximately 2 Pa, and a RF power of 20 W. Then, after removing the resist pattern, a resist pattern (not illustrated) having openings in regions where the source electrode 42 and the drain electrode 43 are to be formed may be formed on the insulator layer 30, by coating a photoresist again on the insulator layer 30, exposing the pattern on the photoresist in the exposure apparatus, and developing the exposed pattern. Thereafter, a Ta layer and a Al layer may be formed by vacuum deposition as stacked metal layers, and the stacked metal layers may be dipped in an organic solvent or the like in order to lift off the stacked metal layers formed on the resist pattern together with the resist pattern. Accordingly, the source electrode 42 and the drain electrode 43 may be formed by the remaining stacked metal layers. Thereafter, an annealing process may be carried out at approximately 550° C. in order to form ohmic contacts at the source electrode 42 and the drain electrode 43.

Figure 9B:
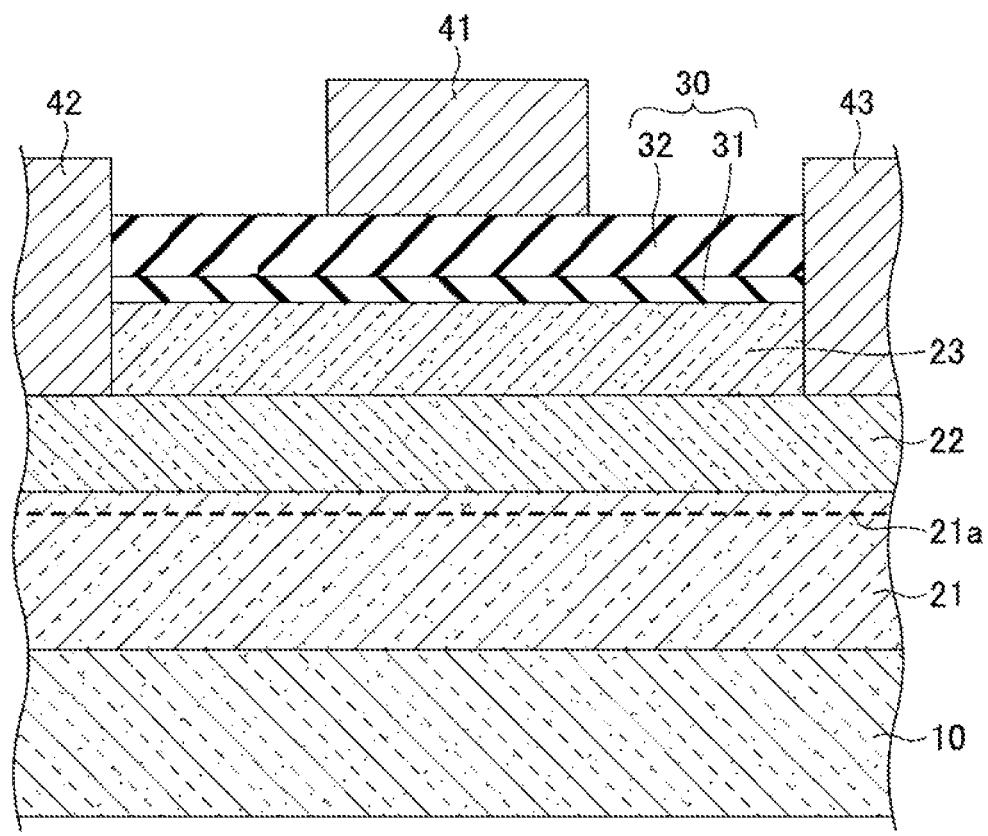

Next, the gate electrode 41 may be formed as illustrated in FIG. 9B. More particularly, a lower resist (for example, a product name PMGI manufactured by MicroChem of the U.S.) and an upper resist (for example, a product name PFI32-A8 manufactured by Sumitomo Chemical Co., Ltd. of Japan) may be spin-coated on the insulator layer 30. Thereafter, the upper resist may be exposed by the exposure apparatus and developed, in order to form an opening having a diameter of approximately 0.8 µm, for example, in the upper resist. Then, the upper resist may be used as a mask to remove the lower resist exposed within the opening in the upper resist, by a wet etching using alkali liquid developer. Next, a Ni layer and a Au layer may be formed by vacuum deposition as stacked metal layers, and the stacked metal layers may be dipped in an organic solvent or the like in order to lift off the stacked metal layers formed on the resist pattern together with the resist pattern. For example, the Ni layer may be formed to a thickness of 10 nm, and the Au layer may be formed to a thickness of 300 nm. Accordingly, the gate electrode 41 may be formed by the remaining stacked metal layers.

(Characteristics of Semiconductor Device in Embodiment)

FIGS. 10 through 13 are diagrams illustrating characteristics of the HEMTs having the structures illustrated in FIGS. 1A and 1B, and the HEMT in this embodiment having the structure illustrated in FIG. 9B. In FIGS. 10 through 13, the HEMT in this embodiment will be referred to as a HEMT 7A. In addition, as described above, the HEMT illustrated in FIG. 1A using the aluminum oxide layer 931 formed by the oxygen plasma oxidation will be referred to as the HEMT 1A, and the HEMT illustrated in FIG. 1B using the aluminum oxide layer 932 formed by the steam oxidation will be referred to as the HEMT 1B.

Figure 10:
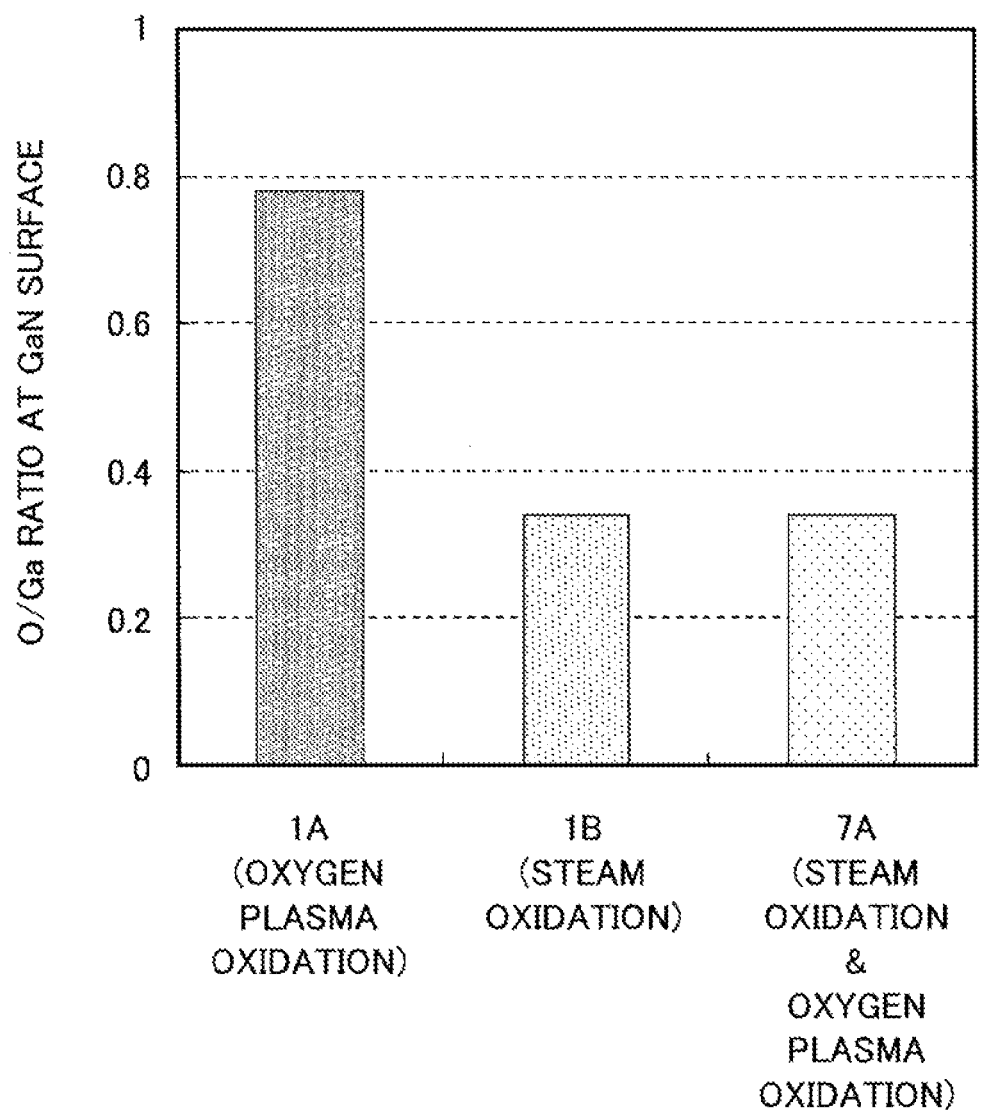
FIG. 10 is a diagram for explaining a O/Ga ratio on a GaN surface of the semiconductor device of the first embodiment.

FIG. 10 is a diagram for explaining a O/Ga ratio on a GaN surface of the semiconductor device of the first embodiment, that is, the HEMT 7A, together with the O/Ga ratios of the HEMTs 1A and 1B. The O/Ga ratio for the HEMT 7A in this embodiment may be approximately 0.34, which is lower than that for the HEMT 1A, and approximately the same as that for the HEMT 1B.

Figure 11:
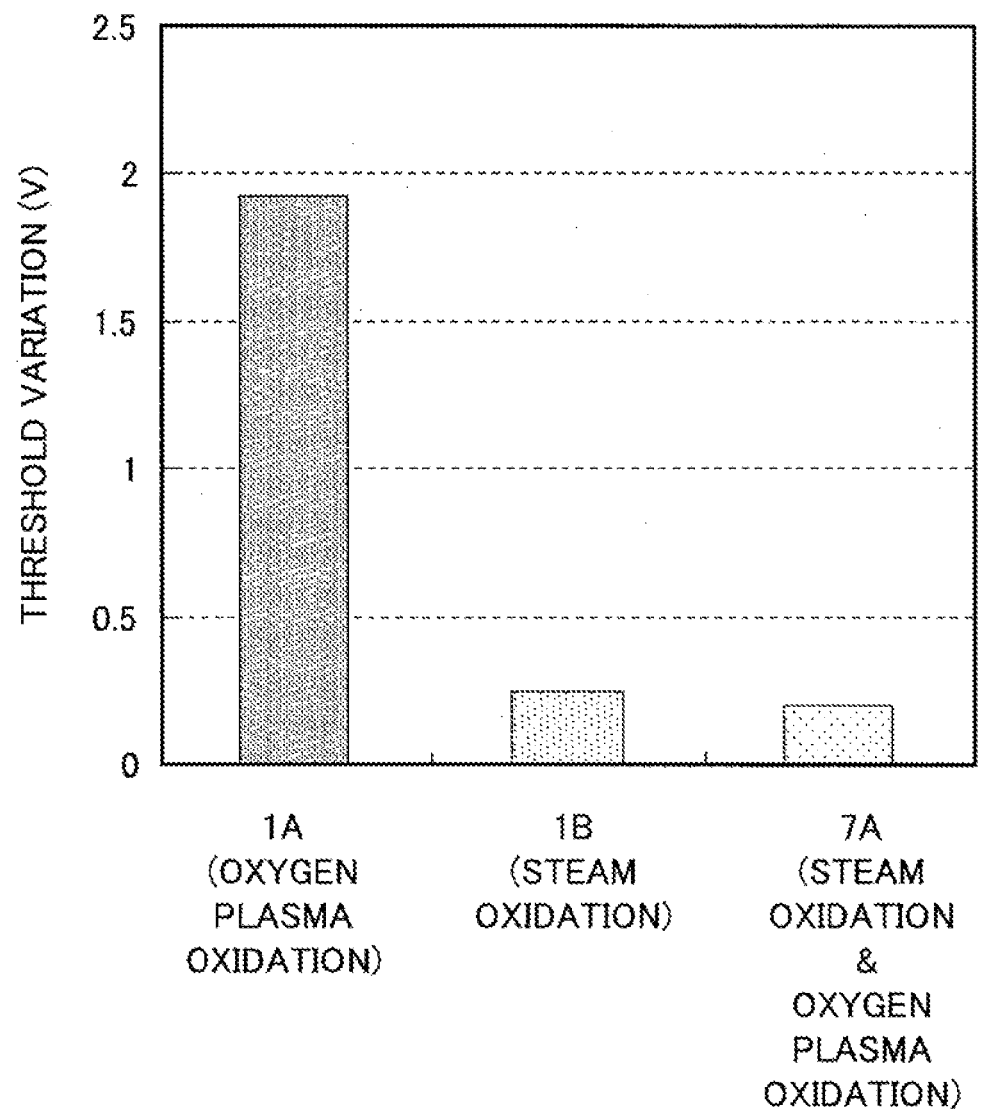
FIG. 11 is a diagram for explaining a threshold variation of the semiconductor of the first embodiment.

FIG. 11 is a diagram for explaining a threshold variation of the semiconductor of the first embodiment, that is, the HEMT 7A, together with the threshold variations of the HEMTs 1A and 1B. The threshold variation for the HEMT 7A in this embodiment may be approximately 0.2 V, which is lower than that for the HEMT 1A, and is even lower than that for the HEMT 1B.

Figure 12:
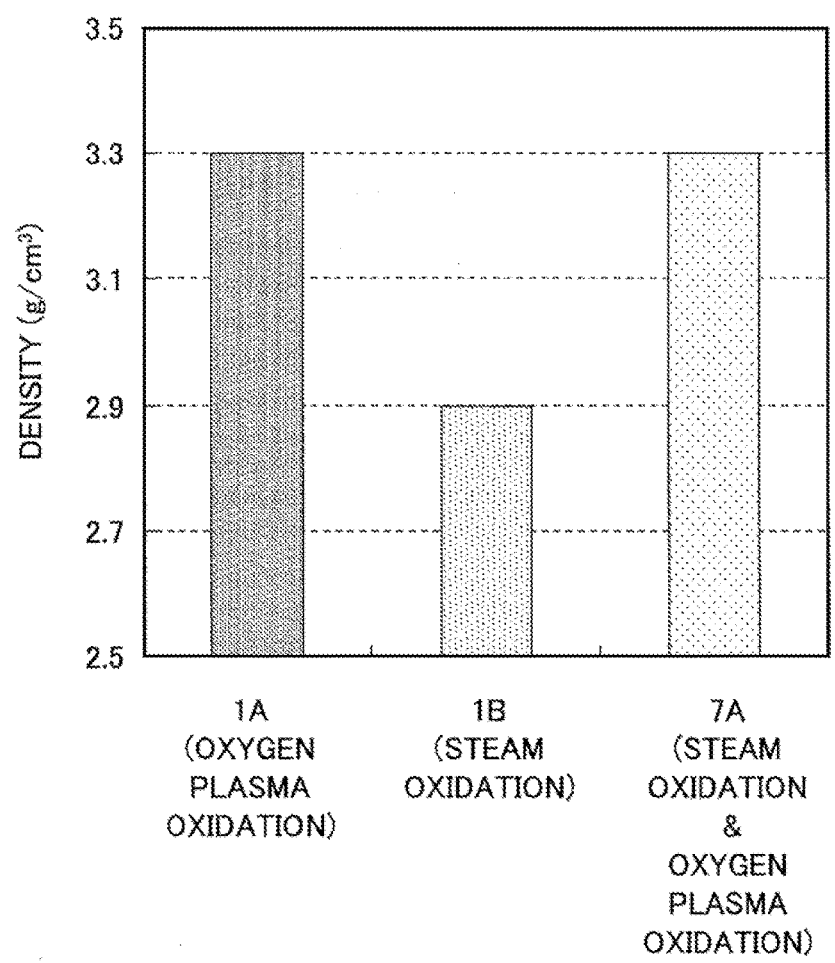
FIG. 12 is a diagram for explaining a density of an insulator layer in the semiconductor device of the first embodiment.

FIG. 12 is a diagram for explaining a density of an insulator layer in the semiconductor device of the first embodiment, that is, the HEMT 7A, together with the densities of the HEMTs 1A and 1B. The density for the HEMT 7A in this embodiment may be approximately 3.3 g/cm$^3$, which is higher than that for the HEMT 1B, and is approximately the same as that for the HEMT 1A.

Figure 13:
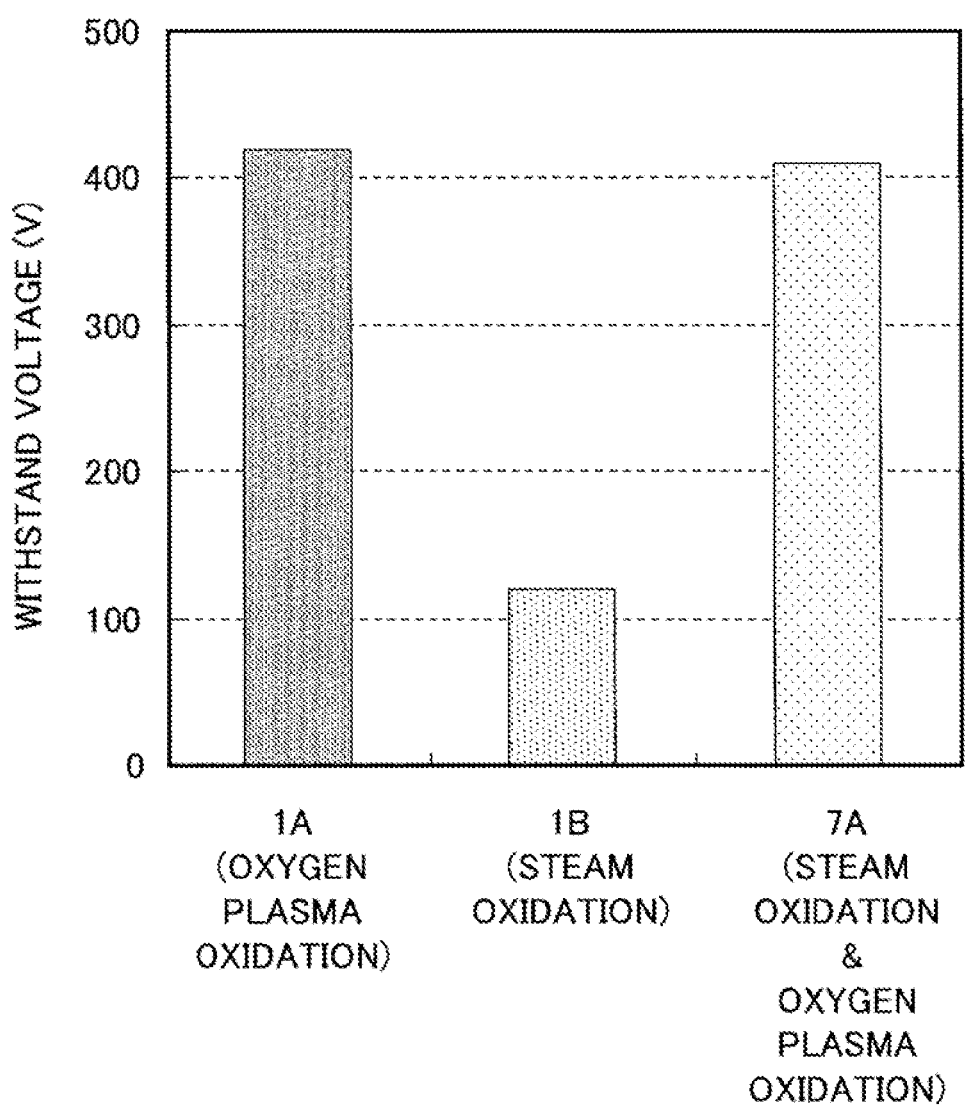
FIG. 13 is a diagram for explaining a withstand voltage of the semiconductor device of the first embodiment.

FIG. 13 is a diagram for explaining a withstand voltage of the semiconductor device of the first embodiment, that is, the HEMT 7A, together with the withstand voltages of the HEMTs 1A and 1B. The withstand voltage for the HEMT 7A in this embodiment may be approximately 410 V, which is higher than that for the HEMT 1B, and is approximately the same as that for the HEMT 1A.

Accordingly, the semiconductor device of the first embodiment, that is, the HEMT 7A, may include the advantageous features of both the HEMT 1A using the aluminum oxide layer 931 formed by the oxygen plasma oxidation, and the HEMT 1B using the aluminum oxide layer 932 formed by the steam oxidation.

In other words, from the point of view of the O/Ga ratio at the GaN surface and the threshold variation of the gate electrode, the semiconductor device of the first embodiment, that is, the HEMT 7A, may have the characteristics that are approximately the same as or better than the characteristics of the HEMT 1B using the aluminum oxide layer 932 formed by the steam oxidation. On the other hand, from the point of view of the density of the insulator layer and the drain-source withstand voltage, the semiconductor device of the first embodiment, that is, the HEMT 7A, may have the characteristics that are approximately the same as the characteristics of the HEMT 1A using the aluminum oxide layer 931 formed by the oxygen plasma oxidation.

Second Embodiment

Next, a description will be given of a second embodiment. The semiconductor device in the second embodiment has a gate recess structure.

(Characteristics of Aluminum Oxide Formed by ALD)

First, semiconductor devices having a gate recess structure different from that of the first embodiment may be fabricated. More particularly, as illustrated in FIGS. 14A and 14B, a semiconductor device having the gate recess structure and using an aluminum oxide layer formed by the oxygen plasma oxidation, as the gate insulator layer, and a semiconductor device having the gate recess structure and using an aluminum oxide layer formed by the steam oxidation, as the gate insulator layer, may be fabricated.

Figure 14A:
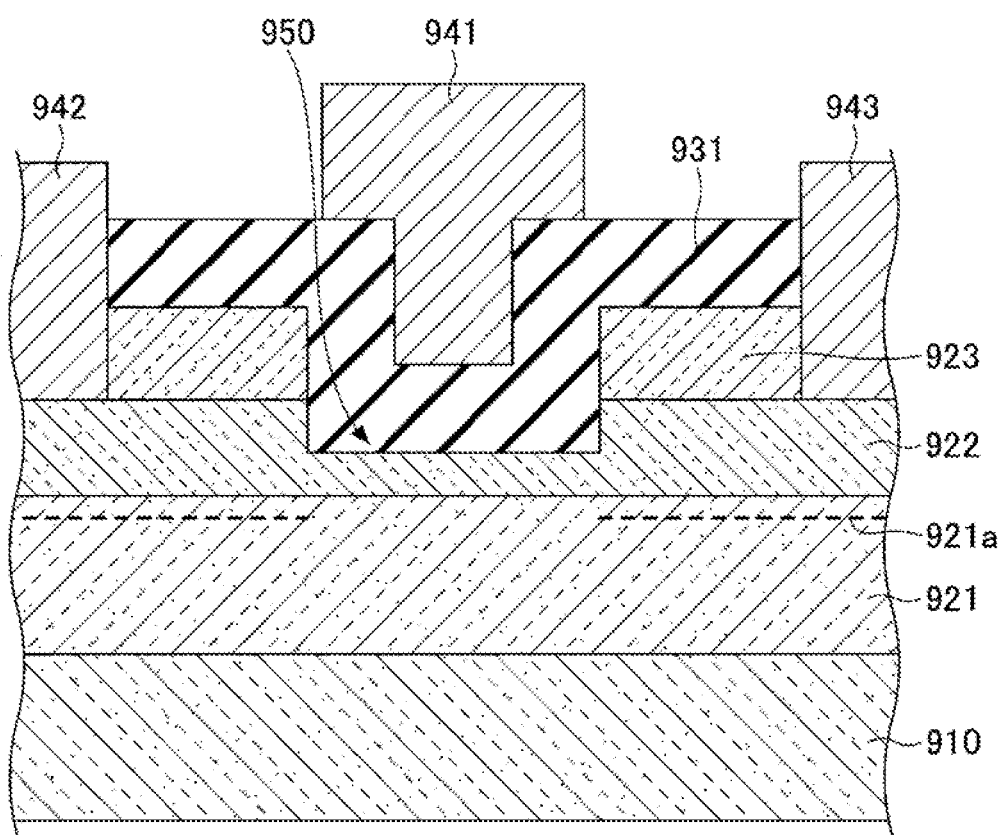
FIGS. 14A and 14B are cross sectional views for explaining the semiconductor device having a structure formed with a recess.

The semiconductor device illustrated in FIG. 14A may be a HEMT using an aluminum oxide layer 931 formed by the oxygen plasma oxidation, as the gate insulator layer. More particularly, a GaN channel layer 921, a AlGaN electron supply layer 922, and a GaN cap layer 923 may be successively stacked, as nitride semiconductor layers, on a substrate 910. Hence, a 2DEG 921a may be formed in the channel layer 921 in a vicinity of an interface between the channel layer 921 and the electron supply layer 922. Thereafter, a gate recess 950 may be formed by removing a part of the nitride semiconductor layers, such as the cap layer 923 and a part of the electron supply layer 922. An aluminum oxide layer 931 may be formed on the gate recess 950 and the cap layer 923 by the oxygen plasma oxidation, as the gate insulator layer. A gate electrode 941 may be formed on the aluminum oxide layer 931. A source electrode 942 and a drain electrode 943 may be formed on the electron supply layer 922.

Figure 14B:
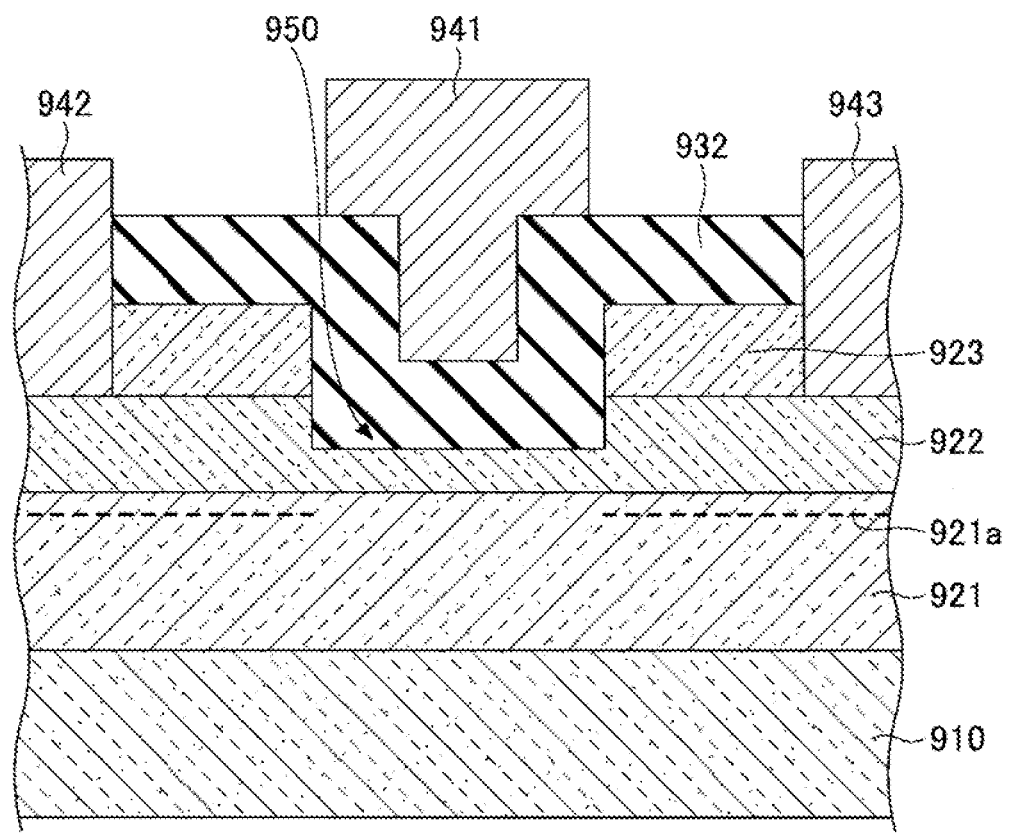

On the other hand, the semiconductor device illustrated in FIG. 14B may be a HEMT using an aluminum oxide layer 932 formed by the steam oxidation, as the gate insulator layer. More particularly, a GaN channel layer 921, a AlGaN electron supply layer 922, and a GaN cap layer 923 may be successively stacked, as nitride semiconductor layers, on a substrate 910. Hence, a 2DEG 921a may be formed in the channel layer 921 in a vicinity of an interface between the channel layer 921 and the electron supply layer 922. Thereafter, a gate recess 950 may be formed by removing a part of the nitride semiconductor layers, such as the cap layer 923 and a part of the electron supply layer 922. An aluminum oxide layer 932 may be formed on the gate recess 950 and the cap layer 923 by the steam oxidation, as the gate insulator layer. A gate electrode 941 may be formed on the aluminum oxide layer 932. A source electrode 942 and a drain electrode 943 may be formed on the electron supply layer 922.

FIGS. 15 through 18 are diagram illustrating characteristics of the HEMTs having the structures illustrated in FIGS. 14A and 14B. In FIGS. 15 through 18, the HEMT illustrated in FIG. 14A using the aluminum oxide layer 931 formed by the oxygen plasma oxidation will be referred to as the HEMT 14A, and the HEMT illustrated in FIG. 14B using the aluminum oxide layer 932 formed by the steam oxidation will be referred to as the HEMT 14B.

Figure 15:
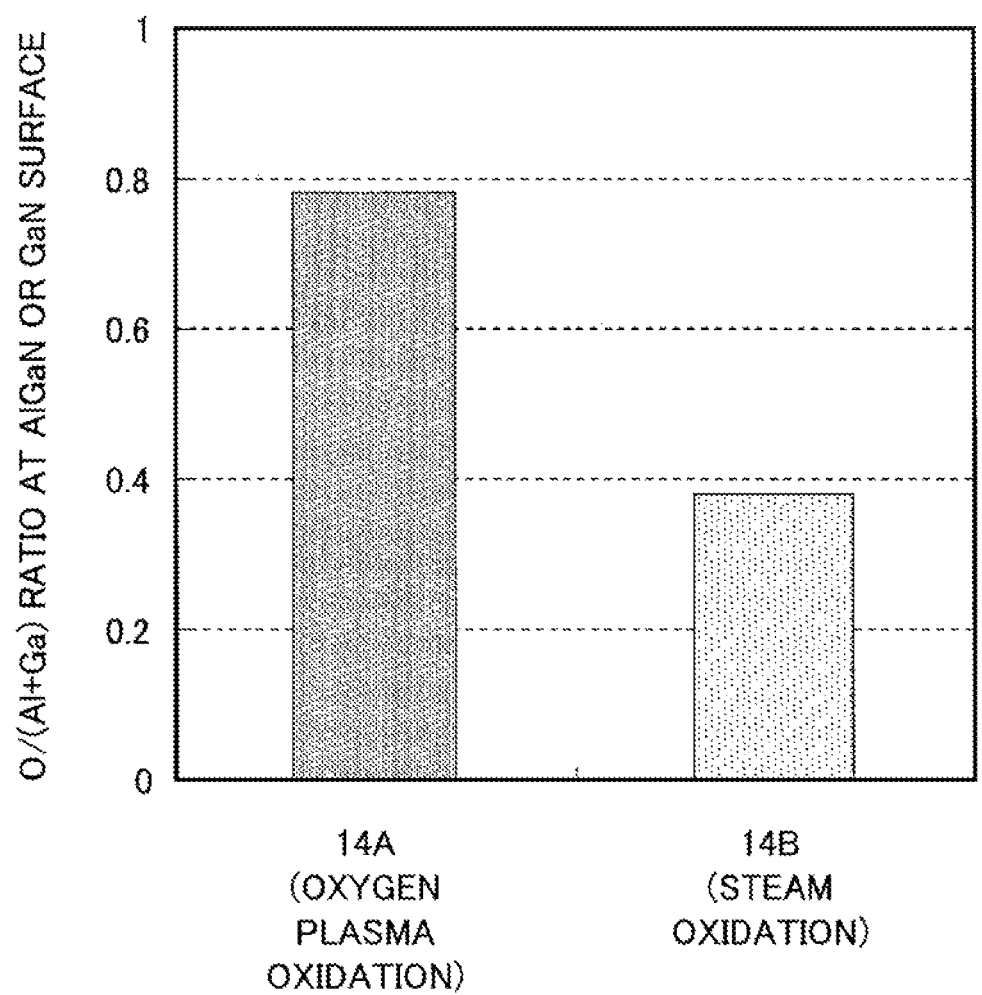
FIG. 15 is a diagram for explaining a O/(Al+Ga) ratio on AlGaN and GaN surfaces of the semiconductor devices having the structure formed with the recess.

FIG. 15 is a diagram for explaining a O/(Al+Ga) ratio (ratio of oxygen atoms with respect to aluminum and gallium atoms) on the AlGaN surface of the electron supply layer 922 and the GaN surface of the cap layer 923 of the semiconductor devices having the structure formed with the recess. The O/(Al+Ga) ratio for the HEMT 14A in this embodiment, using the aluminum oxide layer 931 formed by the oxygen plasma oxidation, may be approximately 0.78. On the other hand, the O/(Al+Ga) ratio for the HEMI 14B in this embodiment, using the aluminum oxide layer 932 formed by the steam oxidation, may be approximately 0.38. In other words, the O/(Al+Ga) ratio at the GaN surface is lower for the HEMI 14B using the aluminum oxide layer 932 formed by the steam oxidation than for the HEMI 14A using the aluminum oxide layer 931 formed by the oxygen plasma oxidation. Hence, a ratio of oxygen atoms with respect to metal atoms included in the nitride semiconductor layer, in a vicinity of an interface between the nitride semiconductor layer and the insulator layer, may be 0.4 or lower for the HEMT 14B.

Figure 16:
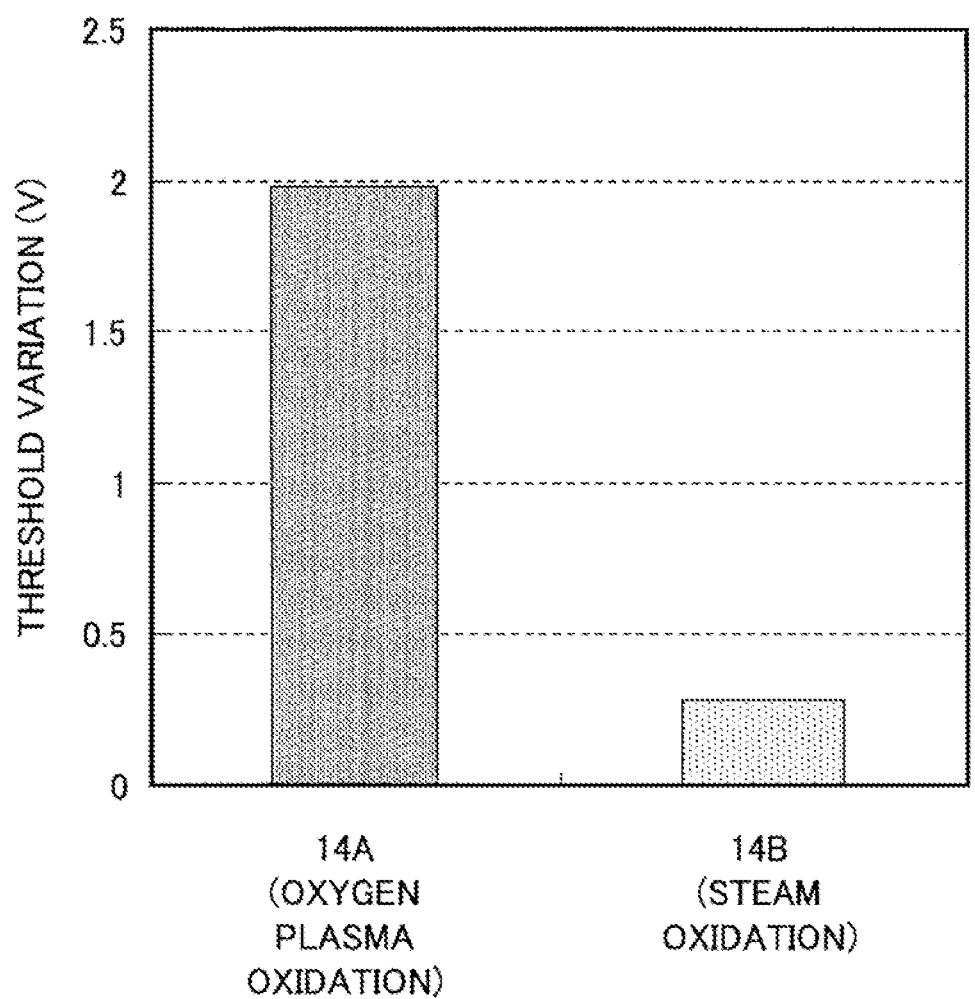
FIG. 16 is a diagram for explaining the threshold variation of the semiconductor devices having the structure formed with the recess.

FIG. 16 is a diagram for explaining the threshold variation of the gate electrode 941 of the semiconductor devices having the structure formed with the recess. The threshold variation for the HEMT 14A in this embodiment, using the aluminum oxide layer 931 formed by the oxygen plasma oxidation, may be approximately 2 V. On the other hand, the threshold variation for the HEMT 14B in this embodiment, using the aluminum oxide layer 932 formed by the steam oxidation, may be approximately 0.3 V. In other words, the threshold variation is lower for the HEMT 14B using the aluminum oxide layer 932 formed by the steam oxidation than for the HEMT 14A using the aluminum oxide layer 931 formed by the oxygen plasma oxidation.

Figure 17:
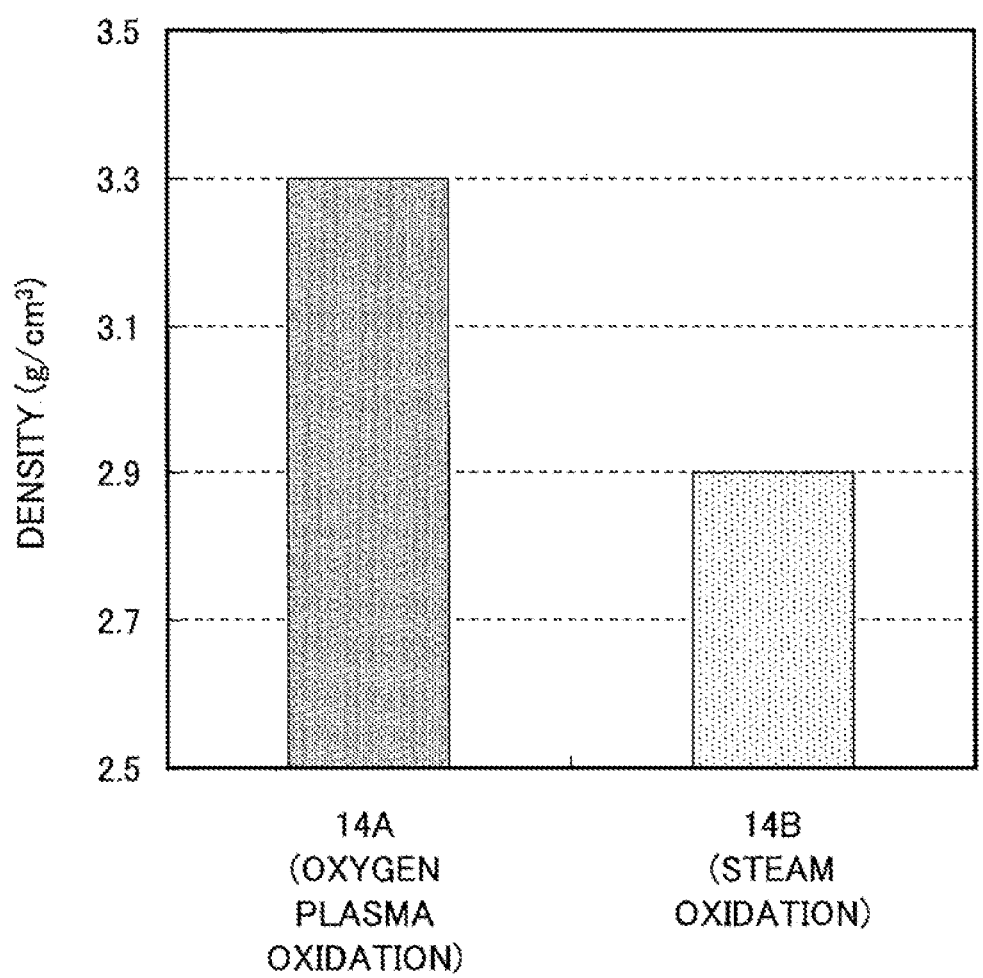
FIG. 17 is a diagram for explaining the density of the insulator layer in the semiconductor devices having the structure formed with the recess.

FIG. 17 is a diagram for explaining the density of the insulator layer in the semiconductor devices having the structure formed with the recess. The density for the HEMT 14A in this embodiment, using the aluminum oxide layer 931 formed by the oxygen plasma oxidation, may be approximately 3.3 g/cm$^3$. On the other hand, the density for the HEMT 14B in this embodiment, using the aluminum oxide layer 932 formed by the steam oxidation, may be approximately 2.9 g/cm$^3$. In other words, the density is lower for the HEMT 14B using the aluminum oxide layer 932 formed by the steam oxidation than for the HEMT 14A using the aluminum oxide layer 931 formed by the oxygen plasma oxidation.

Figure 18:
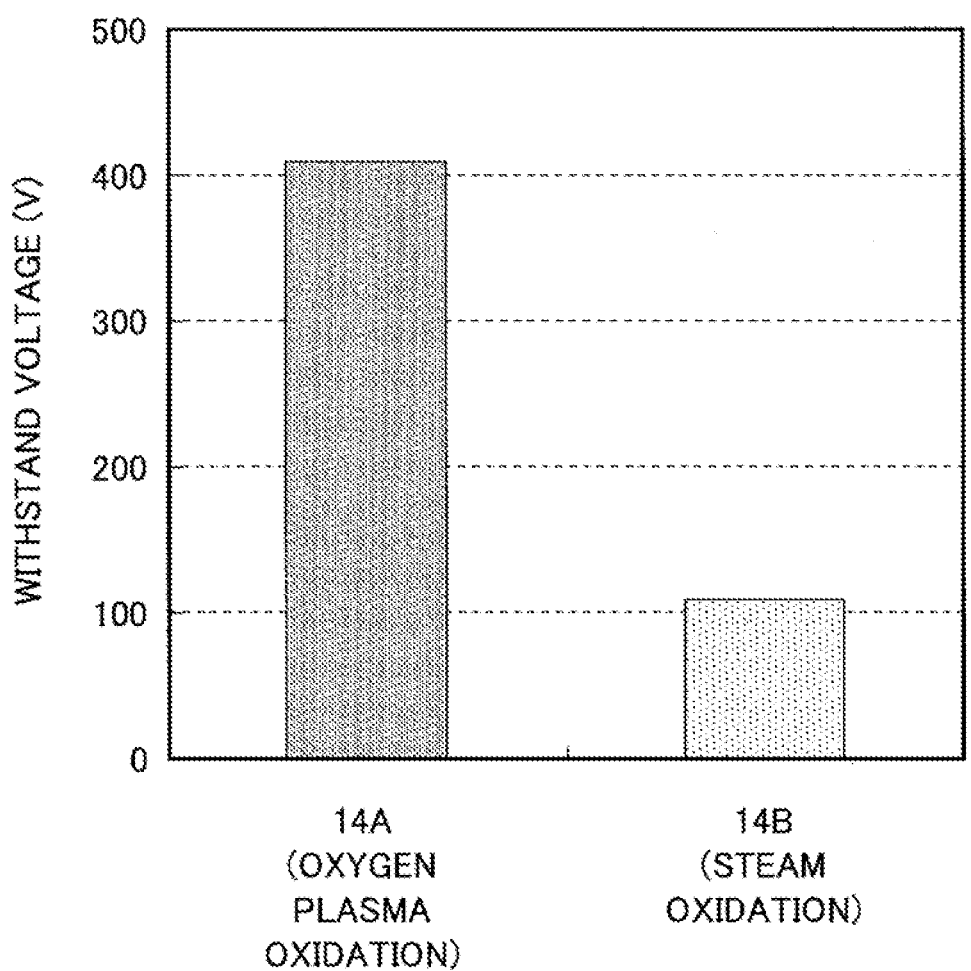
FIG. 18 is a diagram for explaining the withstand voltage of the semiconductor devices having the structure formed with the recess.

FIG. 18 is a diagram for explaining the drain-source withstand voltage of the semiconductor devices having the structure formed with the recess. The withstand voltage for the HEMT 14A in this embodiment, using the aluminum oxide layer 931 formed by the oxygen plasma oxidation, may be approximately 410 V. On the other hand, the withstand voltage for the HEMI 14B in this embodiment, using the aluminum oxide layer 932 formed by the steam oxidation, may be approximately 110 V. In other words, the withstand voltage is lower for the HEMI 14B using the aluminum oxide layer 932 formed by the steam oxidation than for the HEMI 14A using the aluminum oxide layer 931 formed by the oxygen plasma oxidation.

Accordingly, from the point of view of the O/(Al+Ga) ratio at the surface and the threshold variation of the gate electrode, the HEMI 14B using the aluminum oxide layer 932 may be more preferable than the HEMI 14A using the aluminum oxide layer 931. On the other hand, from the point of view of the density of the insulator layer and the drain-source withstand voltage, the HEMI 14A using the aluminum oxide layer 931 may be more preferable than the HEMI 14B using the aluminum oxide layer 932.

In other words, from the point of view of the O/(Al+Ga) ratio at the surface and the threshold variation of the gate electrode, the aluminum oxide layer 932 formed by the steam oxidation may be preferable as the gate insulator layer. On the other hand, from the point of view of the density of the insulator layer and the drain-source withstand voltage, the aluminum oxide layer 931 formed by the oxygen plasma oxidation may be preferable as the gate insulator layer.

Hence, although slight differences exist, the HEMTs having the gate recess structure have tendencies similar to those of the HEMTs not having the gate recess structure.

(Semiconductor Device)

Figure 19:
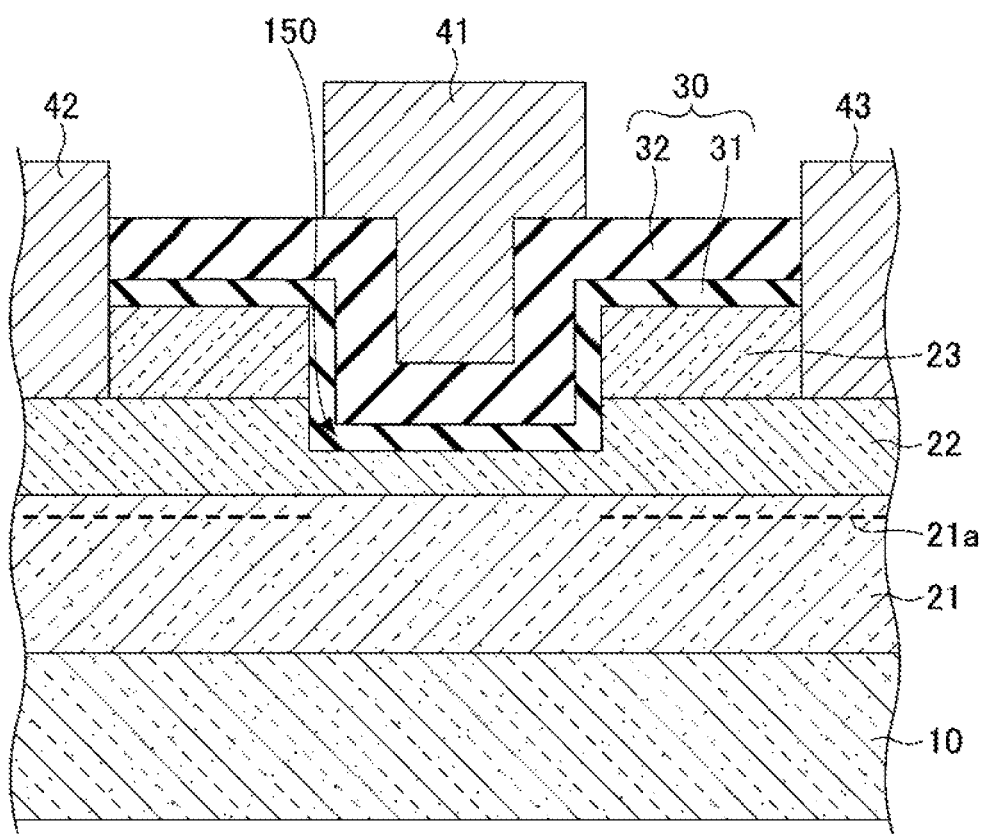
FIG. 19 is a cross sectional view illustrating the structure of the semiconductor device in a second embodiment.

Next, a description will be given of the semiconductor device in the second embodiment, by referring to FIG. 19. FIG. 19 is a cross sectional view illustrating a structure of the semiconductor device in the second embodiment. A HEMT illustrated in FIG. 19 is an example of the semiconductor device in the second embodiment. The HEMT illustrated in FIG. 19 may include nitride semiconductor layers formed on a substrate 10. The nitride semiconductor layers may include a GaN channel layer 21, a AlGaN electron supply layer 22, and a GaN cap layer 23 that are successively stacked on the substrate 10. A 2DEG 21a may be formed in the channel layer 21 in a vicinity of an interface between the channel layer 21 and the electron supply layer 22. In this embodiment, the channel layer 21 may also be referred to as a first semiconductor layer, the electron supply layer 22 may also be referred to as a second semiconductor layer, and the cap layer 23 may also be referred to as a third semiconductor layer.

In this embodiment, a gate recess 150 may be formed by removing a part of the nitride semiconductor layers, such as the cap layer 23 and a part of the electron supply layer 22. By forming the gate recess 150, the 2DEG 21a immediately under a region where the gate recess 150 is formed may be eliminated. An insulator layer 30, that is an example of the gate insulator layer, may be formed on the exposed electron supply layer 22 and the cap layer 23, as the gate insulator layer. The insulator layer 30 may be formed by aluminum oxide layers including a first insulator layer 31 formed on the exposed electron supply layer 22 and the cap layer 23, and a second insulator layer 32 formed on the first insulator layer 31. The first insulator layer 31 may be formed by an aluminum oxide layer that is formed by the steam oxidation. The second insulator layer 32 may be formed by an aluminum oxide layer that is formed by the oxygen plasma oxidation. A gate electrode 41 may be formed on the insulator layer 30, and a source electrode 42 and a drain electrode 43 may be formed on the electron supply layer 22. FIG. 19 illustrates a structure in which the insulator layer 30 is formed on the cap layer 23, however, the insulator layer 30 may be formed on the electron supply layer 22 when no cap layer 23 is formed.

The semiconductor device in this embodiment is not limited to the HEMT using AlGaN and GaN, and may also be applied to semiconductor devices using other nitride semiconductor materials such as InAlN, InGaAlN, and the like.

(Method of Fabricating Semiconductor Device)

Next, a description will be given of a method of fabricating the semiconductor device in this embodiment, by referring to FIGS. 20A through 22. FIGS. 20A, 20B, 21A, 21B, and 22 are cross sectional views for explaining the method of fabricating the semiconductor device of the second embodiment.

Figure 20A:
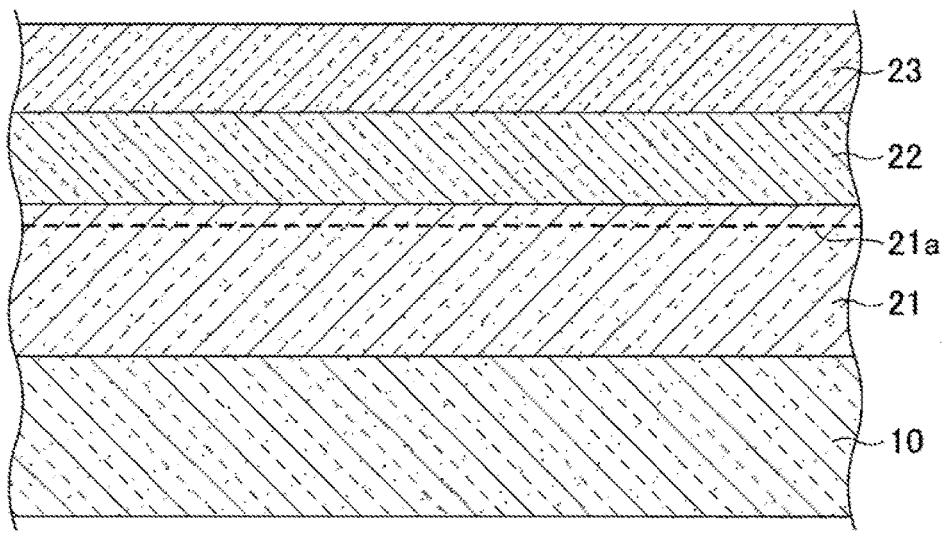
FIGS. 20A and 20B are cross sectional views for explaining the method of fabricating the semiconductor device in the second embodiment.

First, as illustrated in FIG. 20A, nitride semiconductor layers including a buffer layer (not illustrated), the channel layer 21, the electron supply layer 22, and the cap layer 23 are successively formed on the substrate 10 by MOVPE. Although the nitride semiconductor layers are epitaxially grown by the MOVPE in this example, the nitride semiconductor layers may be formed by methods other than the MOVPE, such as MBE. The substrate 10 may be formed by a silicon substrate, and the buffer layer may be formed by AlN to a thickness of 0.1 μm. The channel layer 21 may be formed by i-GaN to a thickness of 3 μm, the electron supply layer 22 may be formed by n-AlGaN to a thickness of 30 nm, and the cap layer 23 may be formed by n-GaN to a thickness of 5 nm. Hence, the 2DEG 21a is formed in the channel layer 21, in a vicinity of the interface between the channel layer 21 and the electron supply layer 22.

In this embodiment, when forming the AlN, GaN, and AlGaN by the MOVPE, gases such as trimethylaluminum (TMA) that becomes the Al source, trimethylgallium (TMG) that becomes the Ga source, and ammonia ($NH_3$) that becomes the N source, may be used as the source gases. The AlN layer, the GaN layer, and the AlGaN layer, that form the nitride semiconductor layers, may be formed by mixing the source gases described above at predetermined ratios depending on the composition of each nitride semiconductor layer. When forming the nitride semiconductor layer of the semiconductor device in this embodiment by the MOVPE, a flow rate of the ammonia gas may be 100 ccm to 10 LM, the pressure within a deposition chamber when forming the nitride semiconductor layer may be 50 Torr to 300 Torr, and the deposition temperature may be 1000° C. to 1200° C.

The electron supply layer 22 may be formed by n-AlGaN that is doped with Si as the n-type impurity element. More particularly, when forming the electron supply layer 22, $SiH_4$ gas may be added to the source gas at a predetermined flow rate, in order to dope the electron supply layer 22 with Si. The density of Si doped into the n-AlGaN may be $1\times10^{18}$ $cm^{-3}$ to $1\times10^{20}$ $cm^{-3}$, and approximately $5\times10^{18}$ $cm^{-3}$, for example.

In addition, the cap layer 23 may be formed by n-GaN that is doped with Si as the n-type impurity element. More particularly, when forming the cap layer 23, $SiH_4$ gas may be added to the source gas at a predetermined flow rate, in order to dope the cap layer 23 with Si. The density of Si doped into the n-GaN may be $1\times10^{18}$ $cm^{-3}$ to $1\times10^{20}$ $cm^{-3}$, and approximately $5\times10^{18}$ $cm^{-3}$, for example.

Figure 20B:
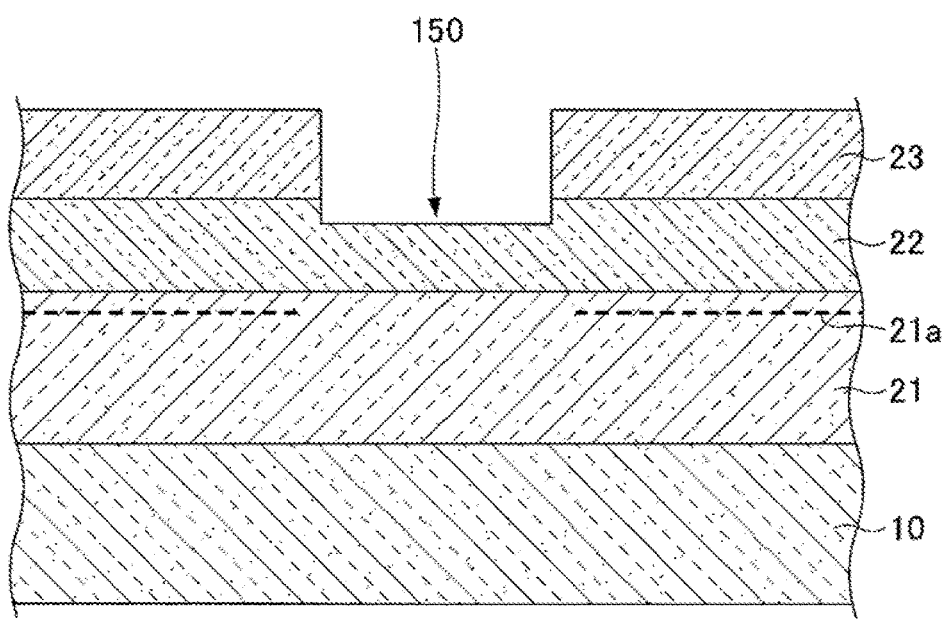

Next, as illustrated in FIG. 20B, the gate recess 150 may be formed in the cap layer 23 and a part of the electron supply layer 22. More particularly, a resist pattern (not illustrated) having openings in a region where the gate recess 150 is to be formed may be formed, by coating a photoresist (not illustrated) on the surface of the cap layer 23, exposing the pattern on the photoresist in an exposure apparatus (not illustrated), and developing the exposed pattern. Thereafter, the cap layer 23 and a part of the electron supply layer 22 in a region where no resist pattern is formed may be removed by RIE or the like. As a result, the gate recess 150 may be formed. Hence, the 2DEG 21a immediately under a region where the gate recess 150 is formed may be eliminated. Then, the resist pattern is removed by an organic solvent or the like.

Figure 21A:
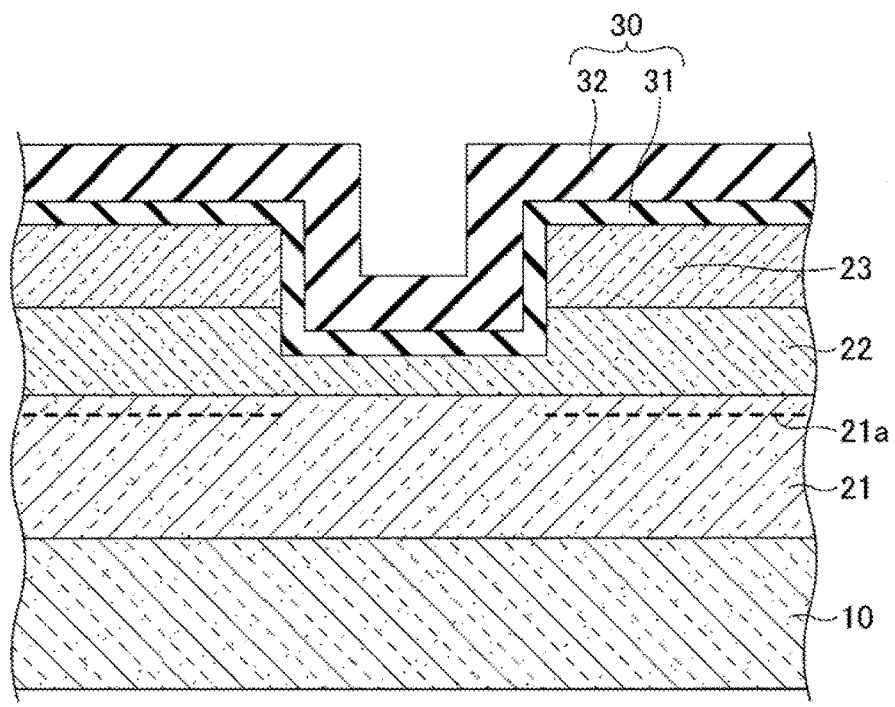
FIGS. 21A and 21B are cross sectional views for explaining the method of fabricating the semiconductor device in the second embodiment.

Next, as illustrated in FIG. 21A, the insulator layer 30 may be formed as the gate insulator layer. More particularly, a transformed layer on the surfaces of the electron supply layer 22 and the cap layer 23 at the location where the gate recess 150 is formed may be cleaned by hydrogen peroxide sulfate and hydrogen fluoride, and thereafter cleaned by water. Thereafter, the first insulator layer 31 may be formed on the electron supply layer 22 and the cap layer 23 at the location where the gate recess 150 is formed, by forming the aluminum oxide layer by the steam oxidation using $Al(CH_3)_3$ and $H_2O$ as the source gases. The thickness of the first insulator layer 31 that is formed may be 5 nm to 10 nm, and in this embodiment, the thickness of the first insulator layer 31 may be 5 nm. Next, the second insulator layer 32 may be formed on the first insulator layer 31 by forming the aluminum oxide layer by the oxygen plasma oxidation using $Al(CH_3)_3$ and $O_2$ as the source gases. The thickness of the second insulator layer 32 that is formed may be 10 nm to 100 nm, and in this embodiment, the thickness of the second insulator layer 32 may be 35 nm. Hence, the insulator layer 30 may be formed by the first insulator layer 31 and the second insulator layer 32. Thereafter, an annealing may be carried out at a temperature of 700° C. to 800° C.

Figure 21B:
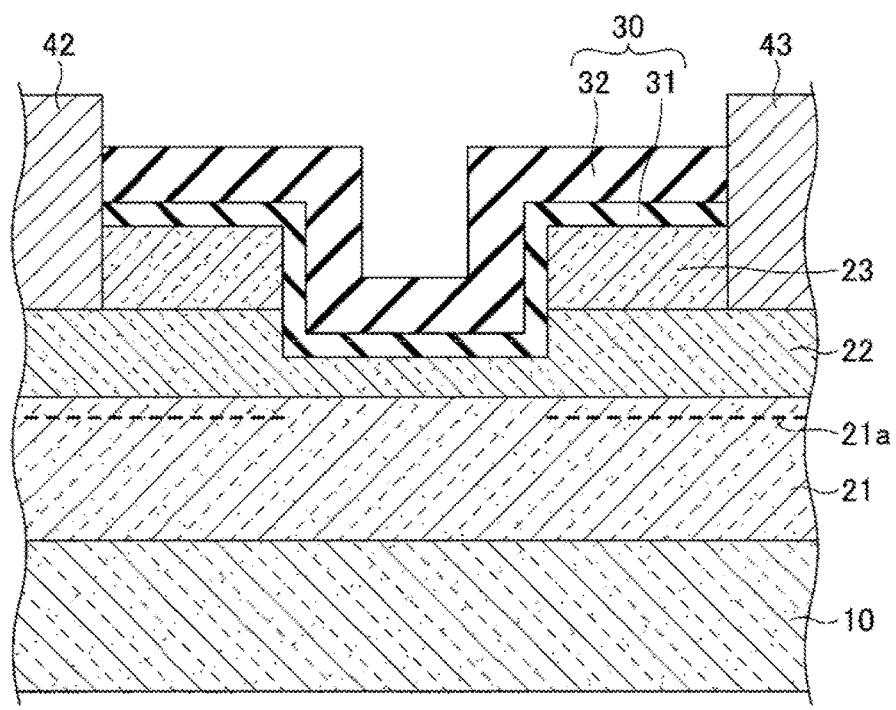

Next, the source electrode 42 and the drain electrode 43 may be formed as illustrated in FIG. 21B. More particularly, a resist pattern (not illustrated) having openings in regions where the source electrode 42 and the drain electrode 43 are to be formed may be formed on the insulator layer 30, by coating a photoresist on the insulator layer 30, exposing the pattern on the photoresist in an exposure apparatus (not illustrated), and developing the exposed pattern. Thereafter, a dry etching, such as a RIE using fluorine gas, chlorine gas, or the like, may be carried out to remove the insulator 30, the cap layer 23, and all of or a part of the electron supply layer 22 in regions where no resist pattern is formed. The dry etching conditions for the nitride semiconductor may include a chlorine ($Cl_2$) gas flow rate of approximately 30 sccm, a chamber pressure of approximately 2 Pa, and a RF power of 20 W. Then, after removing the resist pattern, a resist pattern (not illustrated) having openings in regions where the source electrode 42 and the drain electrode 43 are to be formed may be formed on the insulator layer 30, by coating a photoresist again on the insulator layer 30, exposing the pattern on the photoresist in the exposure apparatus, and developing the exposed pattern. Thereafter, a Ta layer and a Al layer may be formed by vacuum deposition as stacked metal layers, and the stacked metal layers may be dipped in an organic solvent or the like in order to lift off the stacked metal layers formed on the resist pattern together with the resist pattern. Accordingly, the source electrode 42 and the drain electrode 43 may be formed by the remaining stacked metal layers. Thereafter, an annealing process may be carried out at approximately 550° C. in order to form ohmic contacts at the source electrode 42 and the drain electrode 43.

Figure 22:
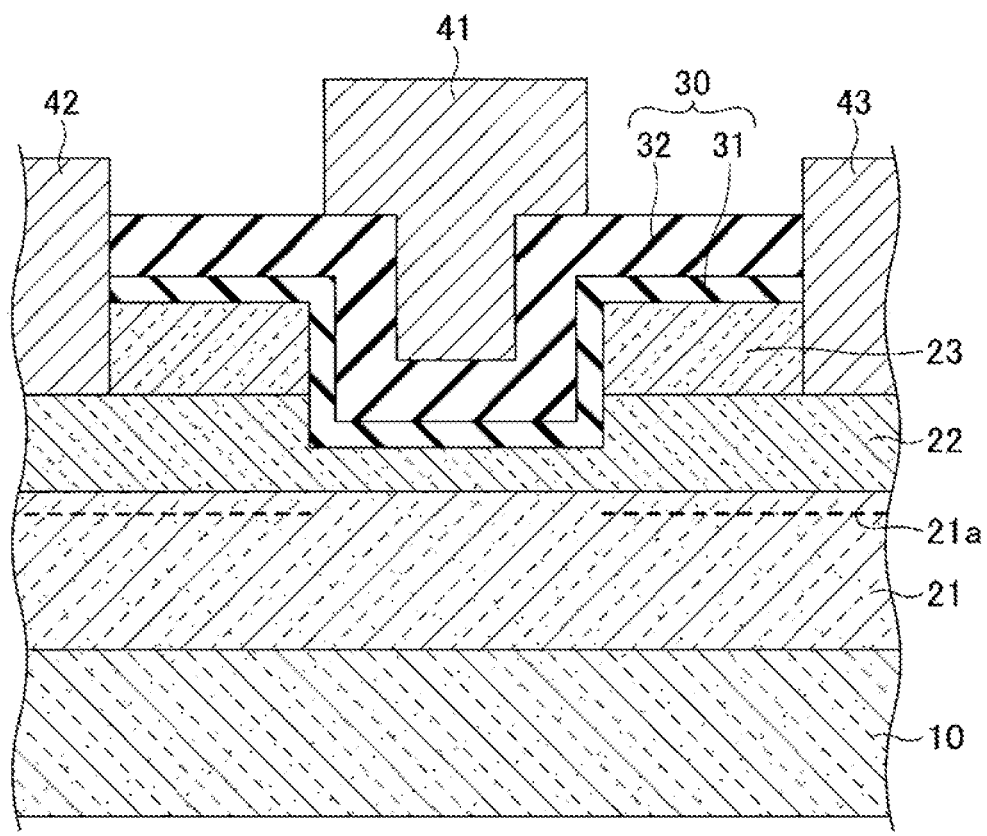
FIG. 22 is a cross sectional view for explaining the method of fabricating the semiconductor device in the second embodiment.

Next, the gate electrode 41 may be formed as illustrated in FIG. 22. More particularly, a lower resist (for example, a product name PMGI manufactured by MicroChem of the U.S.) and an upper resist (for example, a product name PFI32-A8 manufactured by Sumitomo Chemical Co., Ltd. of Japan) may be spin-coated on the insulator layer 30. Thereafter, the upper resist may be exposed by the exposure apparatus and developed, in order to form an opening having a diameter of approximately 0.8 µm, for example, in the upper resist. Then, the upper resist may be used as a mask to remove the lower resist exposed within the opening in the upper resist, by a wet etching using alkali liquid developer. Next, a Ni layer and a Au layer may be formed by vacuum deposition as stacked metal layers, and the stacked metal layers may be dipped in an organic solvent or the like in order to lift off the stacked metal layers formed on the resist pattern together with the resist pattern. For example, the Ni layer may be formed to a thickness of 10 nm, and the Au layer may be formed to a thickness of 300 nm. Accordingly, the gate electrode 41 may be formed by the remaining stacked metal layers.

(Characteristics of Semiconductor Device in Embodiment)

FIGS. 23 through 26 are diagrams illustrating the characteristics of the semiconductor device (HEMT) having the structure illustrated in FIG. 14A, the characteristics of the semiconductor device (HEMT) having the structure illustrated in FIG. 14B, and the characteristics of the semiconductor device (HEMT) in this embodiment. In FIGS. 23 through 26, the HEMT in this embodiment will be referred to as the HEMT 19A. Further, as described above, the HEMT illustrated in FIG. 14A using the aluminum oxide layer 931 formed by the oxygen plasma oxidation will be referred to as the HEMT 14A, and the HEMT illustrated in FIG. 14B using the aluminum oxide layer 932 formed by the steam oxidation will be referred to as the HEMT 14B.

Figure 23:
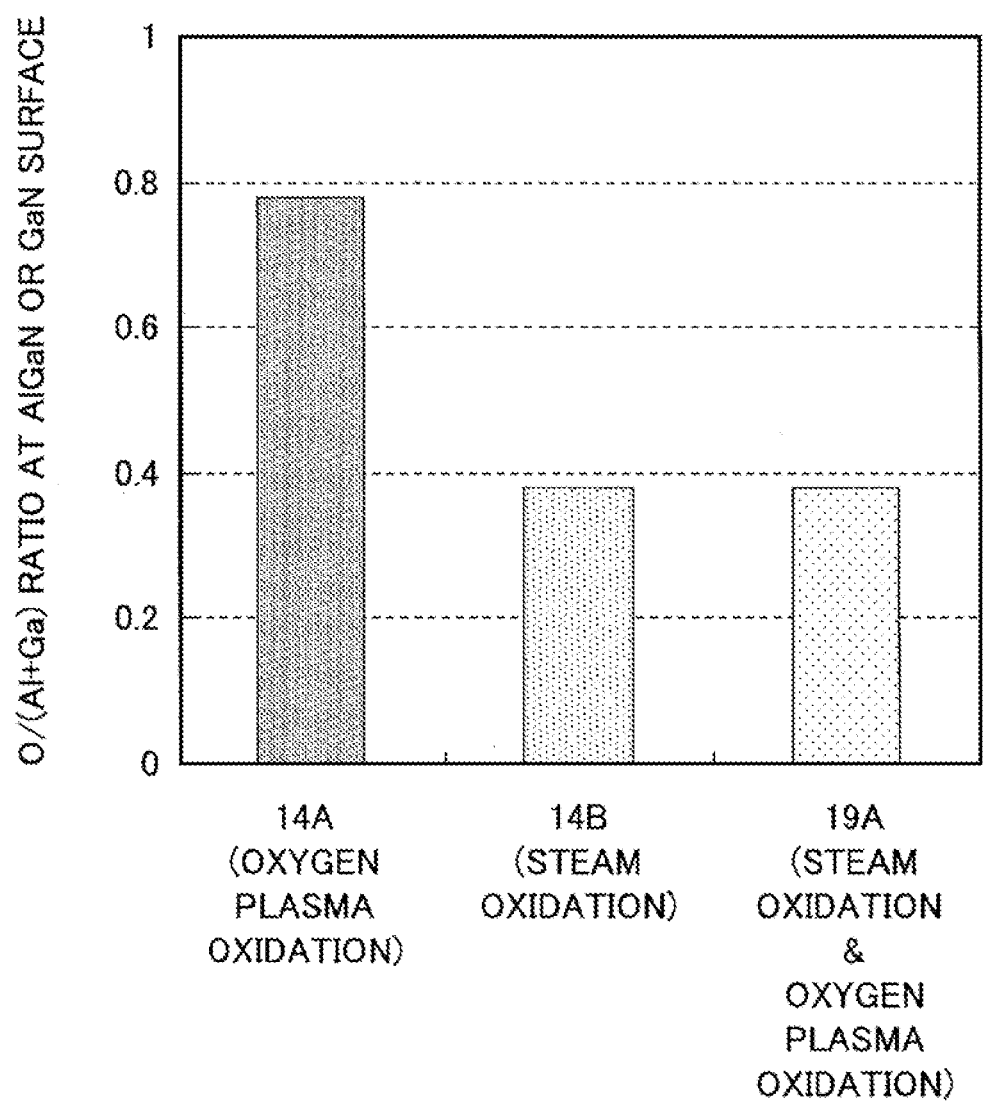
FIG. 23 is a diagram for explaining the O/(Al+Ga) ratio on the AlGaN and GaN surfaces of the semiconductor device in the second embodiment.

FIG. 23 is a diagram for explaining the O/(Al+Ga) ratio on the AlGaN surface of the electron supply layer and the GaN surface of the cap layer of the semiconductor devices having the structure formed with the gate recess. The O/(Al+Ga) ratio for the HEMT 19A in this embodiment, using the aluminum oxide layer 931 formed by the oxygen plasma oxidation, may be approximately 0.34. This O/(Al+Ga) ratio for the HEMT 19A in this embodiment is lower than that for the HEMT 14A using the aluminum oxide layer 931 formed by the oxygen plasma oxidation, and is approximately the same as that for the HEMT 14B using the aluminum oxide layer 932 formed by the steam oxidation. In other words, a ratio of oxygen atoms with respect to metal atoms included in the nitride semiconductor layer, in a vicinity of an interface between the nitride semiconductor layer and the insulator layer, may be 0.4 or lower for the HEMTs 14B and 19A.

Figure 24:
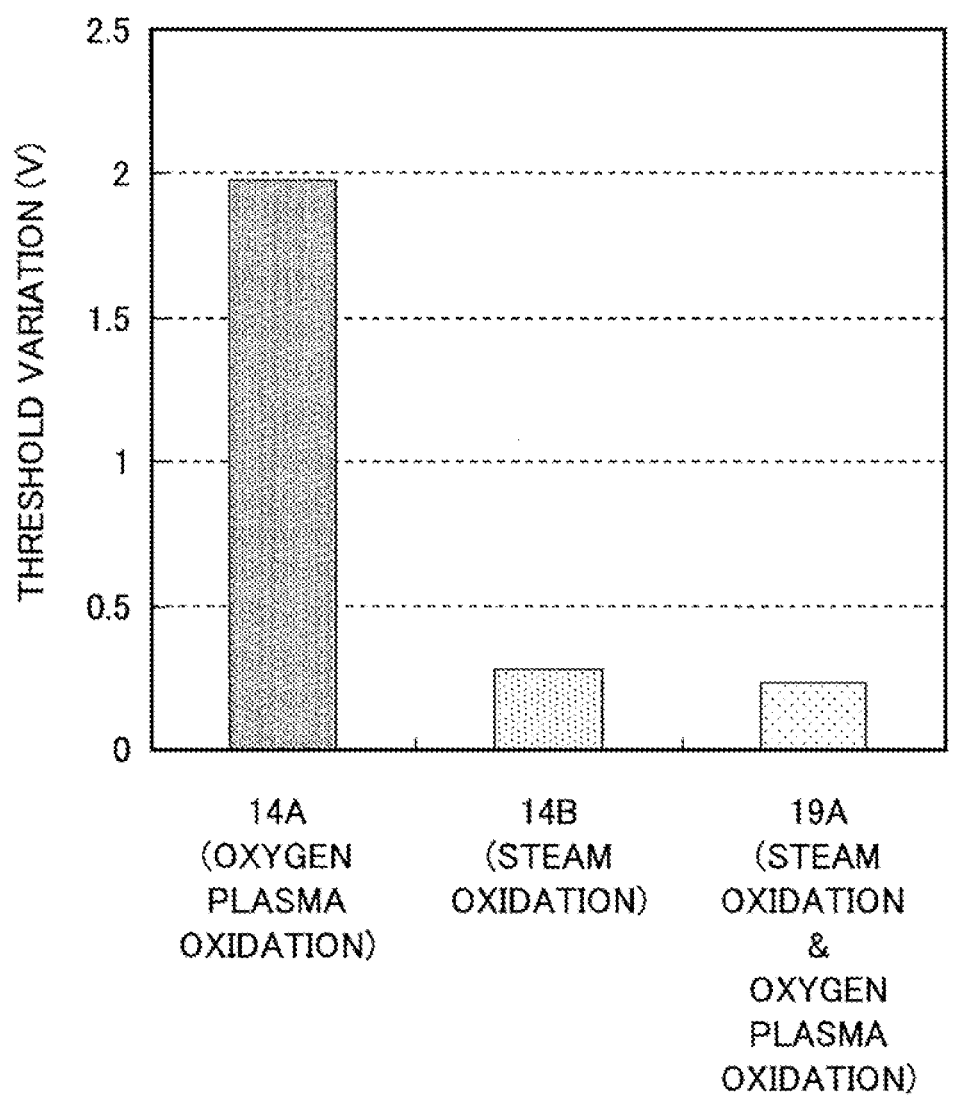
FIG. 24 is a diagram for explaining the threshold variation of the semiconductor device in the second embodiment.

FIG. 24 is a diagram for explaining the threshold variation of the gate electrode of the semiconductor devices having the structure formed with the gate recess. The threshold variation for the HEMT 19A in this embodiment may be 0.25 V. This threshold variation for the HEMT 19A may be lower than that of the HEMT 14A using the aluminum oxide layer 931 formed by the oxygen plasma oxidation, and may be even lower than that of the HEMT 14B using the aluminum oxide layer 932 formed by the steam oxidation.

Figure 25:
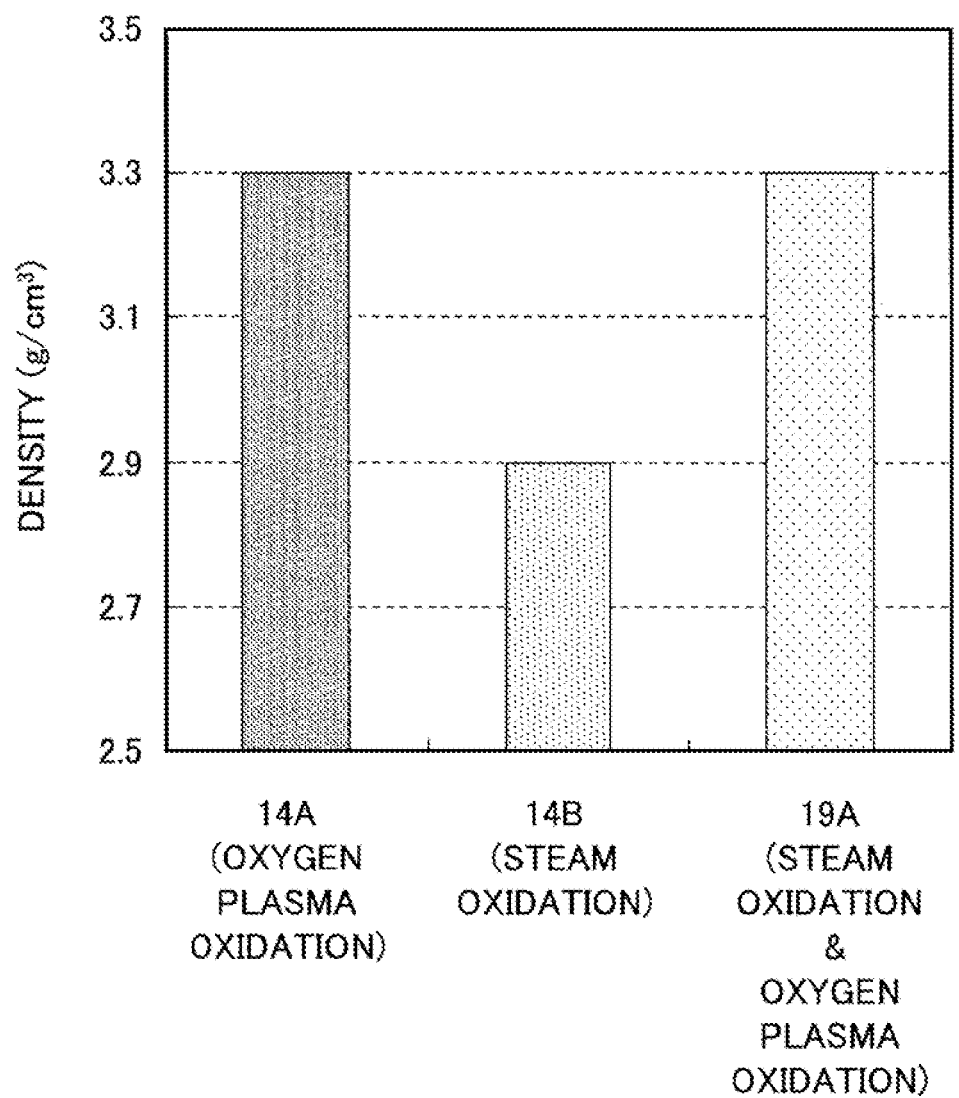
FIG. 25 is a diagram for explaining the density of the insulator layer in the semiconductor device in the second embodiment.

FIG. 25 is a diagram for explaining the density of the insulator layer in the semiconductor devices having the structure formed with the gate recess. The density for the HEMT 19A in this embodiment may be approximately 3.3 g/cm$^3$. This density of the HEMT 19A may be higher than that of the HEMT 14B using the aluminum oxide layer 932 formed by the steam oxidation, and may be approximately the same as that of the HEMT 14A using the aluminum oxide layer 931 formed by the oxygen plasma oxidation.

Figure 26:
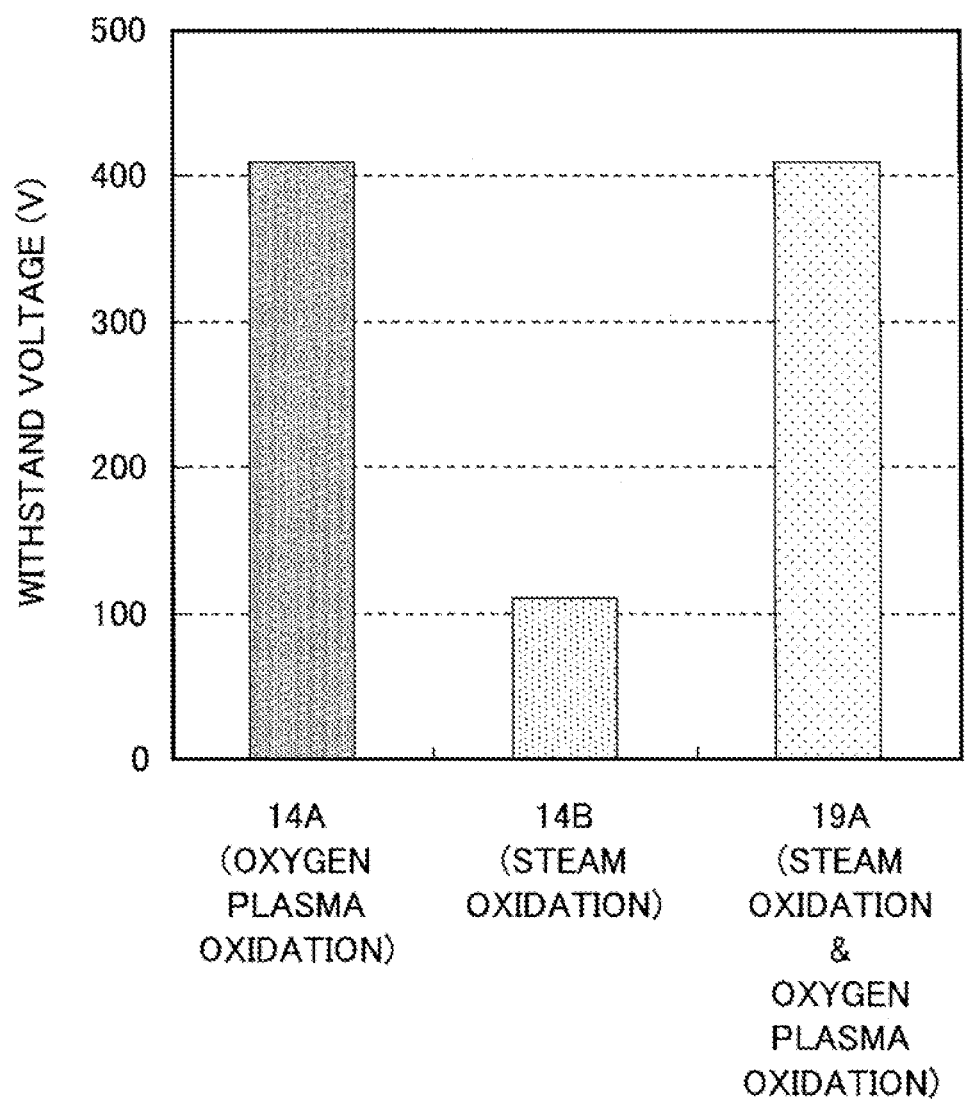
FIG. 26 is a diagram for explaining the withstand voltage of the semiconductor device in the second embodiment.

FIG. 26 is a diagram for explaining the drain-source withstand voltage of the semiconductor devices having the structure formed with the gate recess. The withstand voltage for the HEMT 19A in this embodiment may be approximately 410 V. This withstand voltage of the HEMT 19A may be higher than that of the HEMT 14B using the aluminum oxide layer 932 formed by the steam oxidation, and may be approximately the same as that of the HEMT 14A using the aluminum oxide layer 931 formed by the oxygen plasma oxidation.

Accordingly, the semiconductor device of the second embodiment, that is, the HEMT 19A, may include the advantageous features of both the HEMT 14A using the aluminum oxide layer 931 formed by the oxygen plasma oxidation, and the HEMT 14B using the aluminum oxide layer 932 formed by the steam oxidation.

In other words, from the point of view of the O/Ga ratio at the GaN surface and the threshold variation of the gate electrode, the semiconductor device of the second embodiment may have characteristics that are approximately the same as or better than the characteristics of the HEMT 14B using the aluminum oxide layer formed by the steam oxidation. On the other hand, from the point of view of the density of the insulator layer and the drain-source withstand voltage, the semiconductor device of the second embodiment, that is, the HEMT 19A, may have the characteristics that are approximately the same as than the characteristics of the HEMT 14A using the aluminum oxide layer formed by the oxygen plasma oxidation.

Third Embodiment

Next, a description will be given of a third embodiment. This embodiment may include a semiconductor device, a power supply unit, or a high-frequency amplifier.

Figure 27:
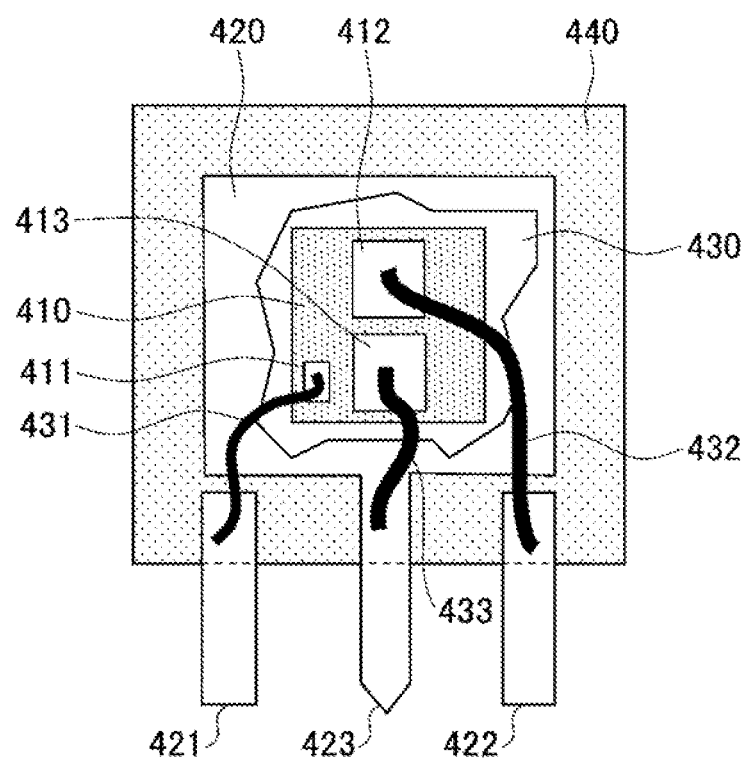
FIG. 27 is a diagram for explaining the semiconductor device in a third embodiment.

The semiconductor device in this embodiment is formed by a discrete package of the semiconductor device in accordance with the first embodiment or the second embodiment. A description will be given of the discrete package of the semiconductor device, by referring to FIG. 27. FIG. 27 is a diagram for explaining the semiconductor device in the third embodiment. FIG. 27 schematically illustrates the inside of the discrete package of the semiconductor device, and the layout of the electrodes and the like may be different from that illustrated for the first embodiment or the second embodiment described above.

(Semiconductor Device)

FIG. 27 illustrates the discrete package of the semiconductor device in accordance with the first embodiment or the second embodiment.

First, the semiconductor device fabricated in accordance with the first embodiment or the second embodiment may be cut by dicing or the like, in order to form a semiconductor chip 410 or HEMT using the GaN semiconductor material. The semiconductor chip 410 may be fixed on a lead frame 420 by a die-attaching agent 430 such as solder. The semiconductor chip 410 corresponds to the semiconductor device in the first embodiment or the second embodiment.

Next, a gate electrode 411 is connected to a gate lead 421 by a bonding wire 431, a source electrode 412 is connected to a source lead 422 by a bonding wire 432, and a drain electrode 413 is connected to a detain lead 423 by a bonding wire 433. The bonding wires 431, 432, and 433 may be formed by a metal material, such as Al or the like. In addition, in this embodiment, the gate electrode 411 may be a kind of gate electrode pad connected to the gate electrode 41 of the semiconductor device in the first embodiment or the second embodiment. Moreover, the source electrode 412 may be a kind of source electrode pad connected to the source electrode 42 of the semiconductor device in the first embodiment or the second embodiment. Furthermore, the drain electrode 413 may be a kind of drain electrode pad connected to the drain electrode 43 of the semiconductor device in the first embodiment or the second embodiment.

Next, the semiconductor chip 410 may be encapsulated by a mold resin 440 by a transfer mold. As a result, the discrete package of the semiconductor device, encapsulating the HEMT using the GaN semiconductor, may be fabricated.

(PFC Circuit, Power Supply Unit, and High-Frequency Amplifier)

Next, a description will be given of a PFC (Power Factor Correction) circuit, a power supply unit, and a high-frequency amplifier in this embodiment. The PFC circuit, the power supply unit, and the high-frequency amplifier in this embodiment are a power supply unit or a high-frequency amplifier that may use the semiconductor device in accordance with the first embodiment or the second embodiment.

(PFC Circuit)

Next, a description will be given of the PFC circuit in this embodiment, by referring to FIG. 28. The PFC circuit in this embodiment may include the semiconductor device in accordance with the first embodiment or the second embodiment.

Figure 28:
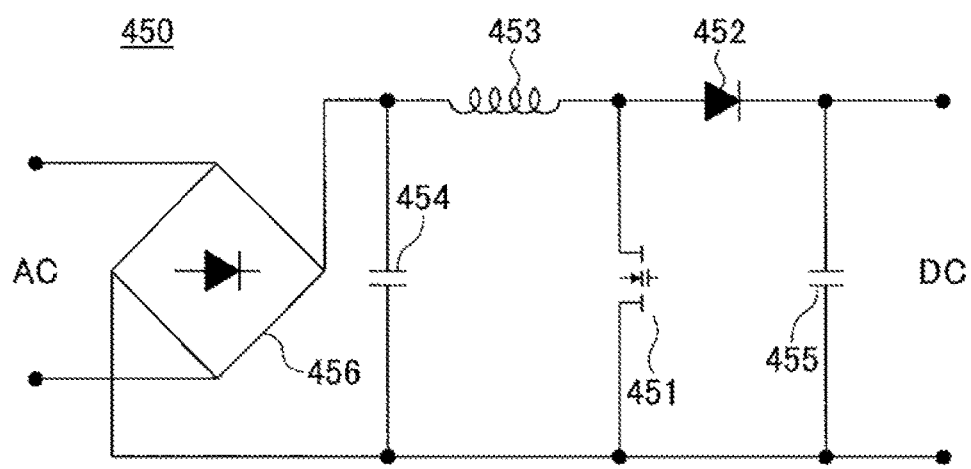
FIG. 28 is a circuit diagram illustrating a PFC circuit in the third embodiment.

FIG. 28 is a circuit diagram illustrating the PFC circuit in the third embodiment. A PFC circuit 450 illustrated in FIG. 28 may include a switching device (or transistor) 451, a diode 452, a choking coil 453, capacitors 454 and 455, and a diode bridge 456 that are connected to an A.C. power supply (not illustrated). The switching device 451 may be formed by the semiconductor device in accordance with the first embodiment or the second embodiment, that is, the HEMT.

In the PFC circuit 450, a drain electrode of the switching device 451, an anode terminal of the diode 452, and one terminal of the choking coil 453 are connected. In addition, a source electrode of the switching device 451, one terminal of the capacitor 454, and one terminal of the capacitor 455 are connected. Further, the other terminal of the capacitor 454 and the other terminal of the choking coil 453 are connected. The other terminal of the capacitor 455 and a cathode terminal of the diode 452 are connected, and the A.C. power supply is connected between the two terminals of the capacitor 454 via the diode bridge 456. In this PFC circuit 450, a D.C. output is obtained from the two terminals of the capacitor 455.

(Power Supply Unit)

Next, a description will be given of the power supply unit in this embodiment, by referring to FIG. 29. The power supply unit in this embodiment may include the semiconductor device in accordance with the first embodiment or the second embodiment.

Figure 29:
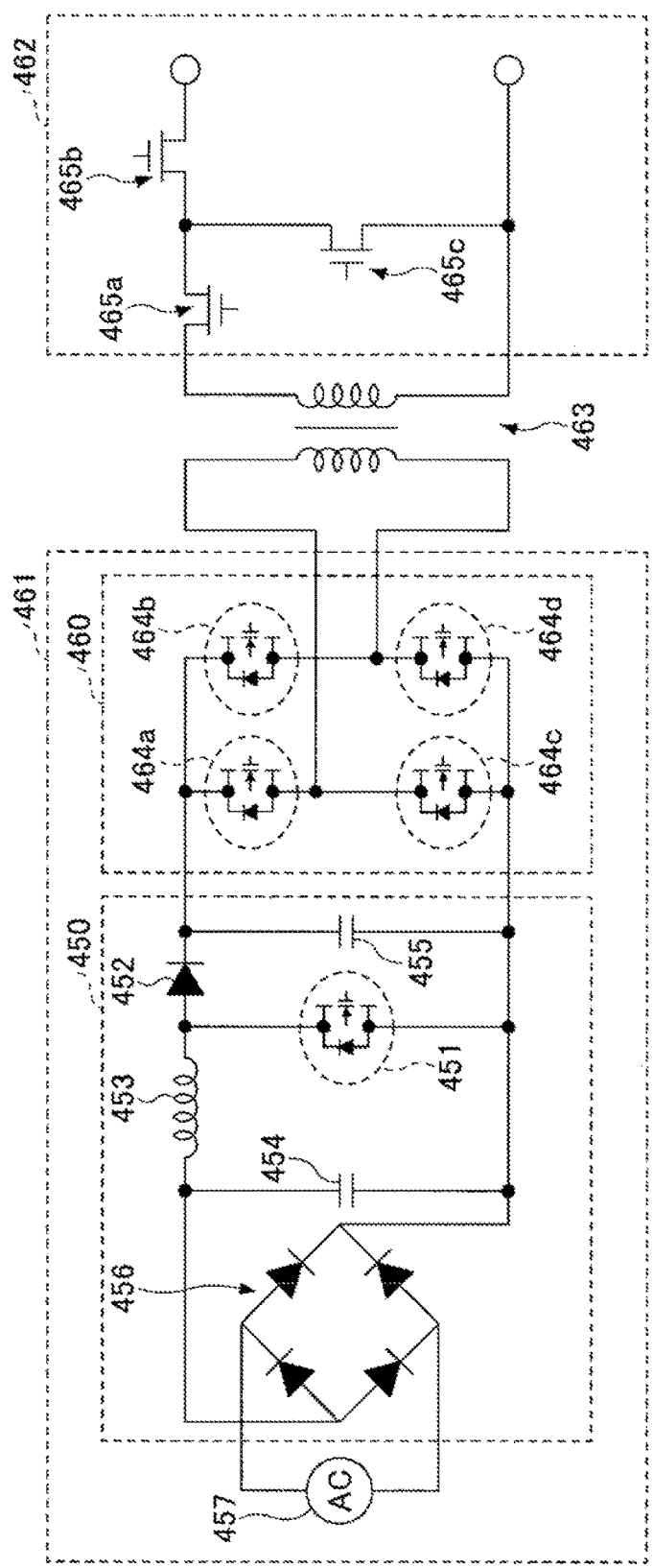
FIG. 29 is a circuit diagram illustrating a power supply unit in the third embodiment.

FIG. 29 is a circuit diagram illustrating the power supply unit in the third embodiment. The power supply unit illustrated in FIG. 29 may include the PFC 450 described above.

More particularly, the power supply unit in this embodiment may include a high-voltage primary side circuit 461, a low-voltage secondary side circuit 462, and a transformer 463 arranged between the primary side circuit 461 and the secondary side circuit 462.

The primary side circuit 461 may include the PFC circuit 450 described above, and an inverter circuit connected between the two terminals of the capacitor 455 within the PFC circuit 450. A full bridge inverter circuit 460 is an example of such an inverter circuit. The full bridge inverter circuit 460 may include a plurality of switching devices, and may include four switching devices 464a, 464b, 464c, and 464f in this example. The secondary side circuit 462 may include a plurality of switching devices, and may include three switching devices 46a, 465b, and 465c in this example. An A.C. power supply 457 is connected to the diode bridge 456.

In this embodiment, the semiconductor device in accordance with the first embodiment or the second embodiment, that is, the HEMT, may be used for the switching device 451 of the PFC circuit 450 within the primary side circuit 461. In addition, the semiconductor device in accordance with the first embodiment or the second embodiment, that is, the HEMT, may be used for each of the switching devices 464a, 464b, 464c, and 464d of the full bridge inverter circuit 460. On the other hand, a FET having a MIS (Metal Insulator Semiconductor) structure using silicon may be used for each of the switching devices 465a, 465b, and 465c of the secondary side circuit 462.

(High-Frequency Amplifier)

Next, a description will be given of the high-frequency amplifier in this embodiment, by referring to FIG. 30. The high-frequency amplifier in this embodiment may include the semiconductor device in accordance with the first embodiment or the second embodiment, and may produce a high output.

Figure 30:
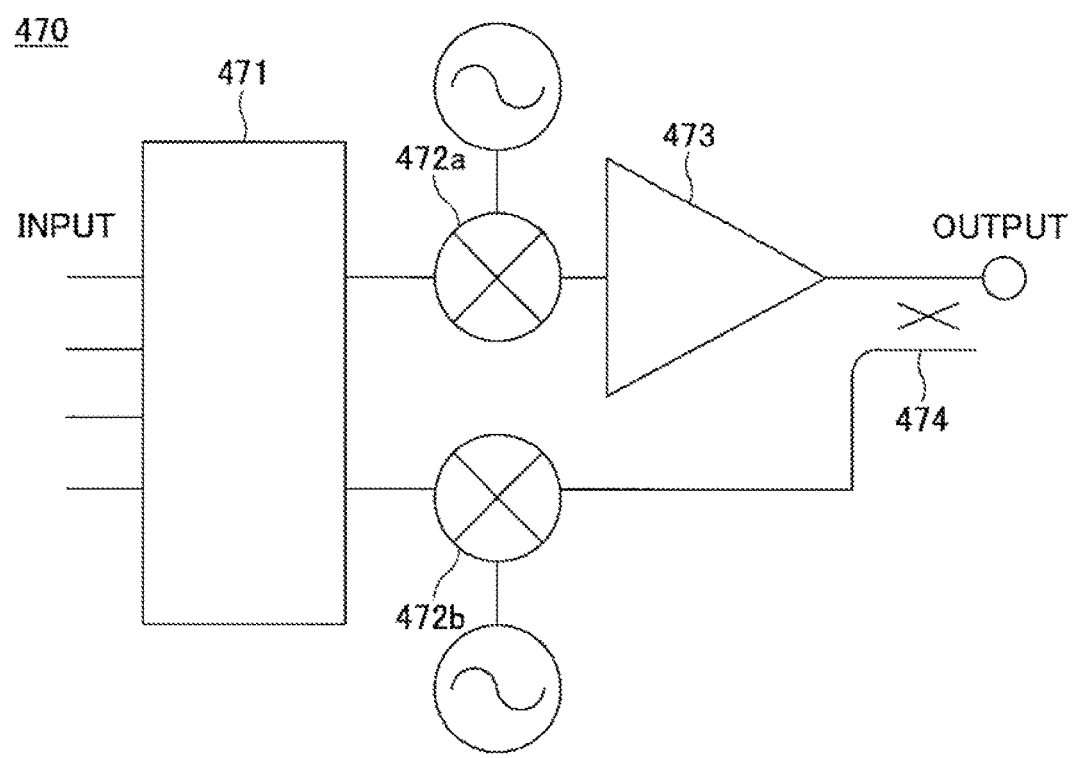
FIG. 30 is a diagram illustrating a high-frequency amplifier in the third embodiment.

FIG. 30 is a diagram illustrating the high-frequency amplifier in the third embodiment. The high-frequency amplifier illustrated in FIG. 30 may include a digital predistortion circuit 471, mixers 472a and 472b, a power amplifier 473, and a directional coupler 474.

The digital predistortion circuit 471 may compensate for a non-linear distortion in an input signal. The mixer 472a may mix the input signal compensated of the non-linear distortion, and an A.C. signal. The power amplifier 473 may amplify the mixed signal from the mixer 472a. The power amplifier 473 may include the semiconductor device in accordance with the first embodiment or the second embodiment, that is, the HEMT. The directional coupler 474 may monitor input and output signals thereof. In FIG. 30, a switching may performed to mix an output side signal and an A.C. signal in the mixer 472b and to supply the mixed signal to the digital predistortion circuit 471.

In each of the embodiments described above, the gate insulator layer may be made of a material selected from a group consisting of an oxide, a nitride, and an oxynitride of any one or a combination of aluminum hafnium, silicon, and nickel.

Although the embodiments are numbered with, for example, "first," "second," or "third," the ordinal numbers do not imply priorities of the embodiments. Many other variations and modifications will be apparent to those skilled in the art.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A semiconductor device comprising:
    a nitride semiconductor layer formed on a substrate;
    an insulator layer formed on the nitride semiconductor layer;
    a gate electrode formed on the insulator layer; and
    a source electrode and a drain electrode formed on the nitride semiconductor layer,
    wherein the nitride semiconductor layer includes a first semiconductor layer formed on the substrate, and a second semiconductor layer formed on the first semiconductor layer,
    wherein the insulator layer includes a first insulator layer made of aluminum oxide and formed on the second semiconductor layer, and a second insulator layer made of aluminum oxide and formed on the first insulator layer,
    wherein a ratio of oxygen atoms with respect to metal atoms included in the nitride semiconductor layer, in a vicinity of an interface between the second semiconductor layer and the first insulator layer, is 0.4 or lower, and
    wherein a density of aluminum hydroxide included each of the first and second insulator layers of the insulator layer is 4% or lower.

2. The semiconductor device as claimed in claim 1, wherein the first insulator layer has a thickness in a range of 5 nm to 10 nm, and the second insulator layer has a thickness in a range of 10 nm to 100 nm.

3. The semiconductor device as claimed in claim 1, wherein the nitride semiconductor layer further includes a third semiconductor layer formed on the second semiconductor layer.

4. The semiconductor device as claimed in claim 3, wherein the third semiconductor layer is made of a material including GaN.

5. The semiconductor device as claimed in claim 4, wherein the first semiconductor layer is made of a material including GaN.

6. The semiconductor device as claimed in claim 5, wherein the second semiconductor layer is made of a material including AlGaN.

7. The semiconductor device as claimed in claim 1, further comprising:
    a HEMT (High Electron Mobility Transistor).

8. A power supply unit comprising:
    the semiconductor device as claimed in claim 1.

9. An amplifier comprising:
    the semiconductor device as claimed in claim 1.

* * * * *